(12) United States Patent
Koga et al.

(10) Patent No.: US 7,119,722 B2
(45) Date of Patent: Oct. 10, 2006

(54) VARIABLE LENGTH DECODING DEVICE AND VARIABLE LENGTH DECODING METHOD AND REPRODUCING SYSTEM

(75) Inventors: Yoshihiro Koga, Osaka (JP); Masakazu Fujimoto, Osaka (JP); Michihiro Matsumoto, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 105 days.

(21) Appl. No.: 11/050,880

(22) Filed: Jan. 27, 2005

(65) Prior Publication Data

US 2005/0168362 A1  Aug. 4, 2005

(30) Foreign Application Priority Data

Jan. 29, 2004   (JP)   ............... P2004-021268
Aug. 24, 2004   (JP)   ............... P2004-244236

(51) Int. Cl.
*H03M 7/40* (2006.01)
(52) U.S. Cl. ........................... 341/67; 341/65
(58) Field of Classification Search ................ 341/59, 341/65, 67, 106
See application file for complete search history.

(56) References Cited

U.S. PATENT DOCUMENTS

| | | | | |
|---|---|---|---|---|
| 5,057,837 A | * | 10/1991 | Colwell et al. | 341/55 |
| 5,398,027 A | * | 3/1995 | Ooi | 341/67 |
| 5,604,498 A | * | 2/1997 | Park | 341/65 |
| 5,990,812 A | * | 11/1999 | Bakhmutsky | 341/67 |
| 6,069,575 A | * | 5/2000 | Kinouchi et al. | 341/67 |
| 6,246,347 B1 | * | 6/2001 | Bakhmutsky | 341/67 |
| 6,667,701 B1 | * | 12/2003 | Tao | 341/67 |

FOREIGN PATENT DOCUMENTS

JP  11-184750  7/1999

* cited by examiner

*Primary Examiner*—Linh Nguyen
(74) *Attorney, Agent, or Firm*—McDermott Will & Emery LLP

(57) ABSTRACT

A variable length decoding device comprising:
 a memory for laying out data which is identical to data memorized on a lower-bit side at an optional address on an upper-bit side at an address subsequent to the optional address and memorizing the layed-out data;
 a buffer register having a bit width at least equal to a bit width of the memory for storing data loaded from the memory; and
 an address register for storing a value of an address at which the memory is accessed (address value) on an upper-bit side and storing number of data which was referred to in the buffer register on a lower-bit side, characterized in that
 a data shift operation using the number of the data which was referred to and number of data which is currently referred to is executed to the buffer register so that data to be presently referred to is extracted from the buffer register for the variable length decoding, the number of the data which was referred to on the lower-bit side of the address register is renewed by adding thereto the number of the data which has been currently referred to in response to the extraction of the data from the buffer register, the address value to be stored on the upper-bit side of the address register is maintained when the renewed number of the data which was referred to on the lower-bit side of the address register is not carried up, and the carry-up is used to renew the address value to be a next address value when the renewed number of the data is carried up.

20 Claims, 24 Drawing Sheets extraction of data
of data number N

F I G. 1
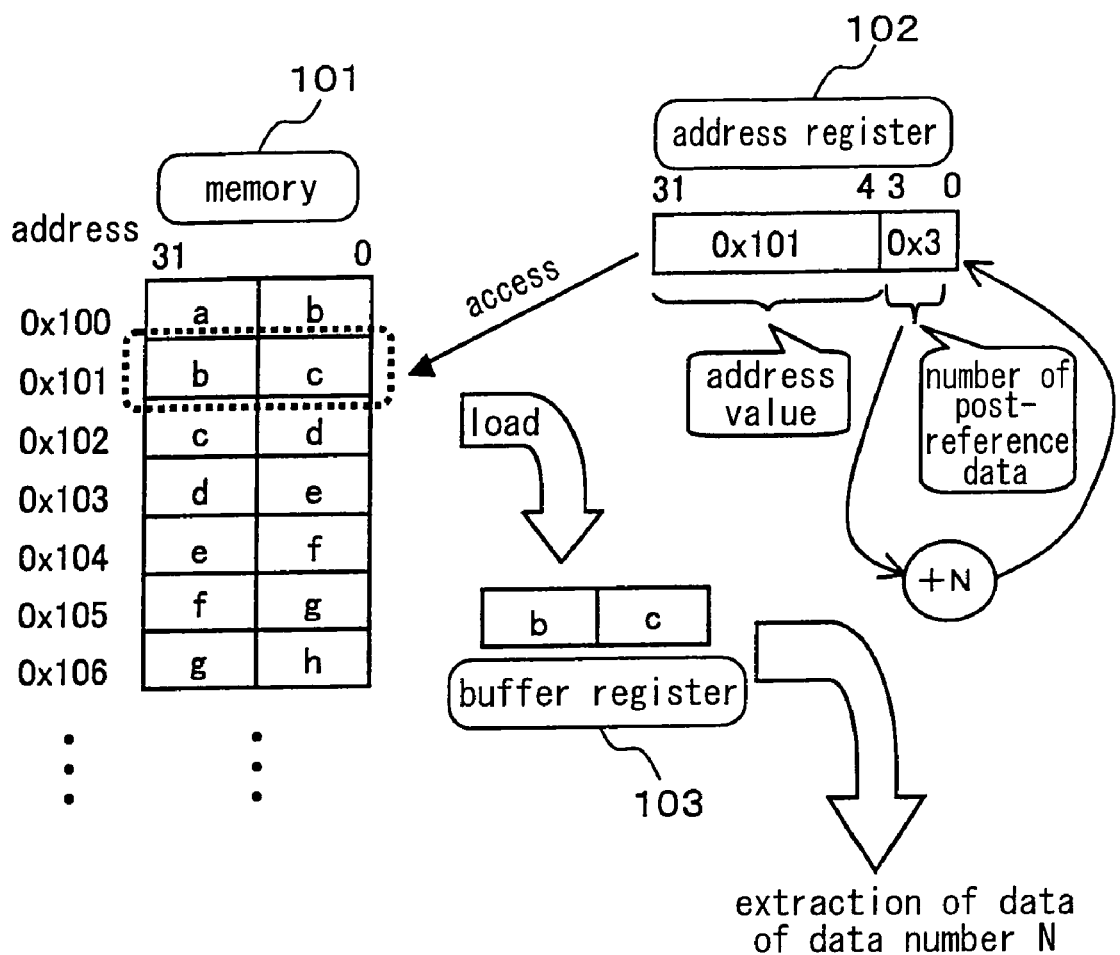

F I G. 4
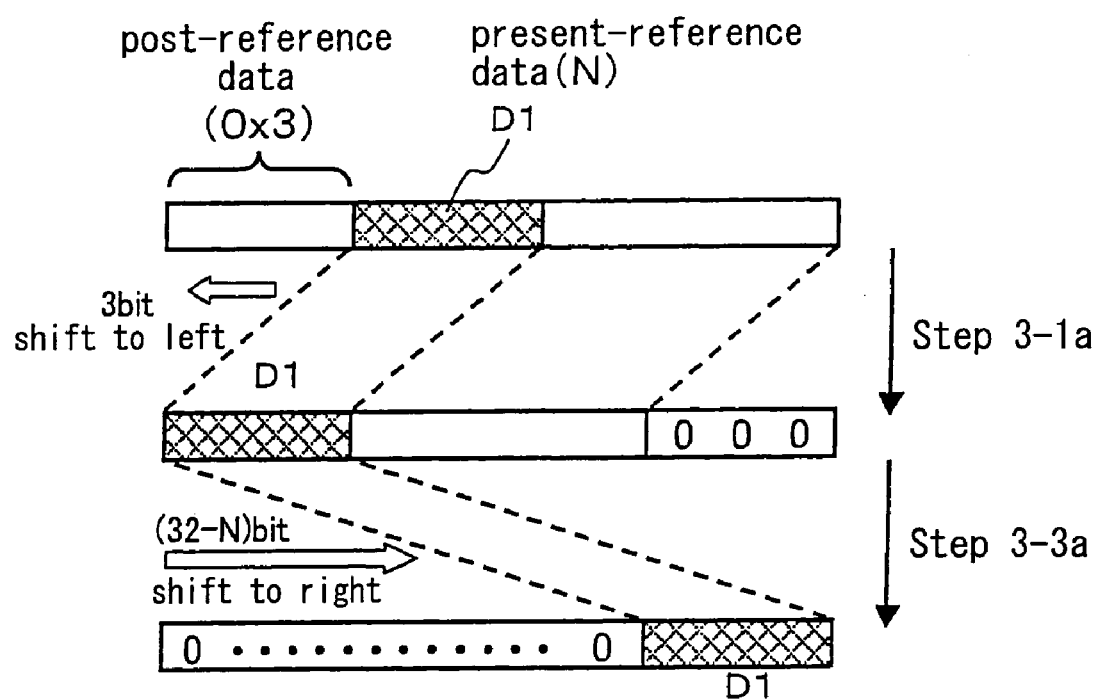

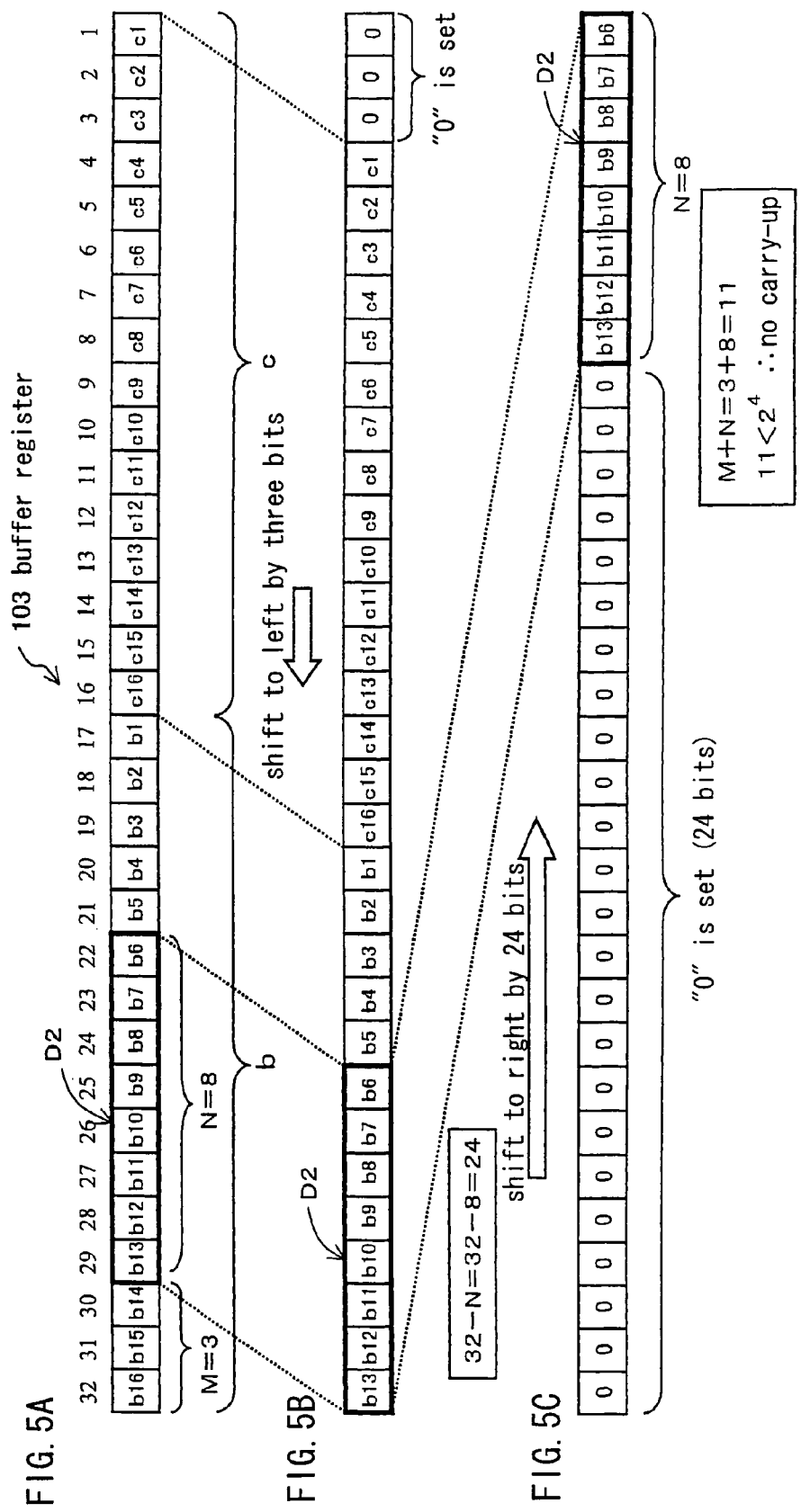

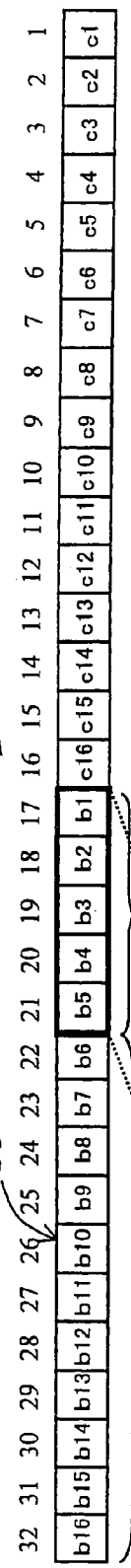
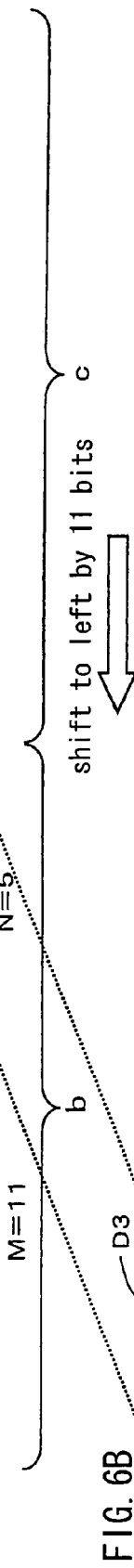
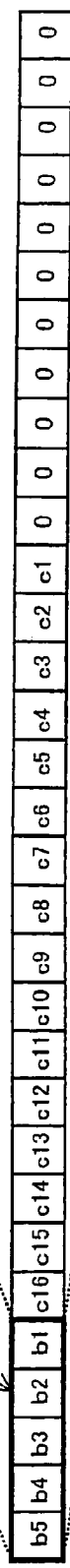
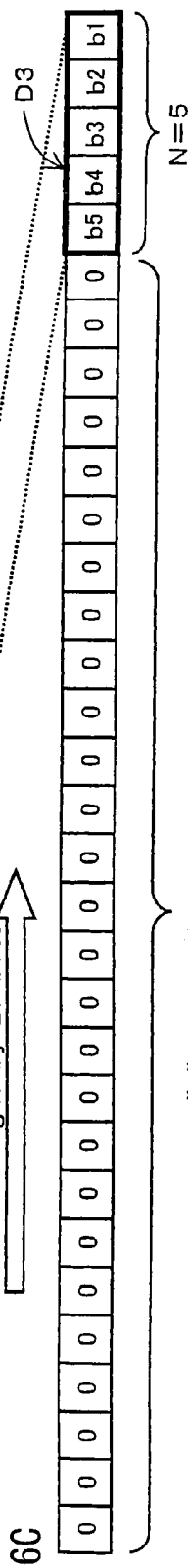
FIG. 6A
FIG. 6B
FIG. 6C

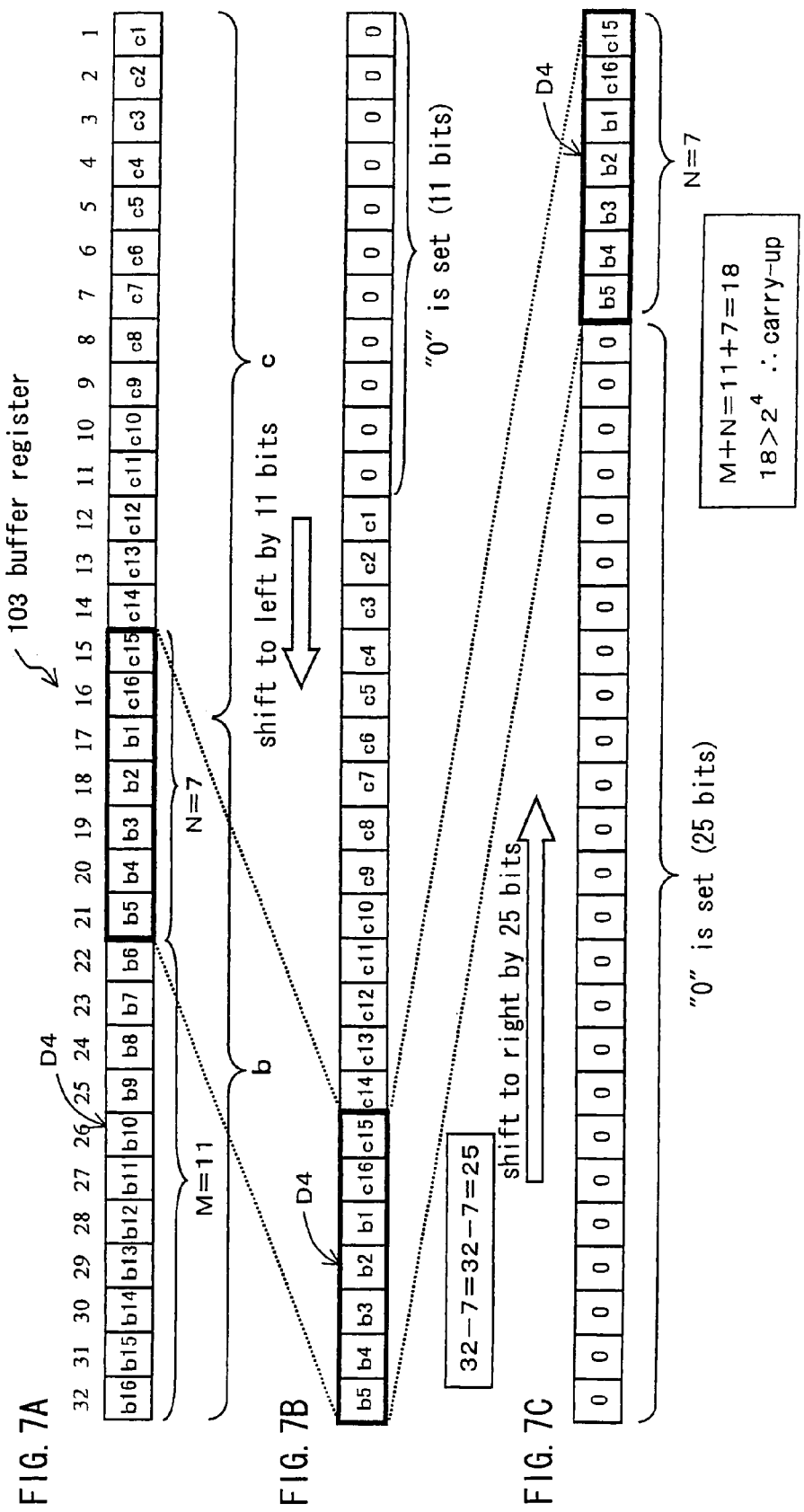

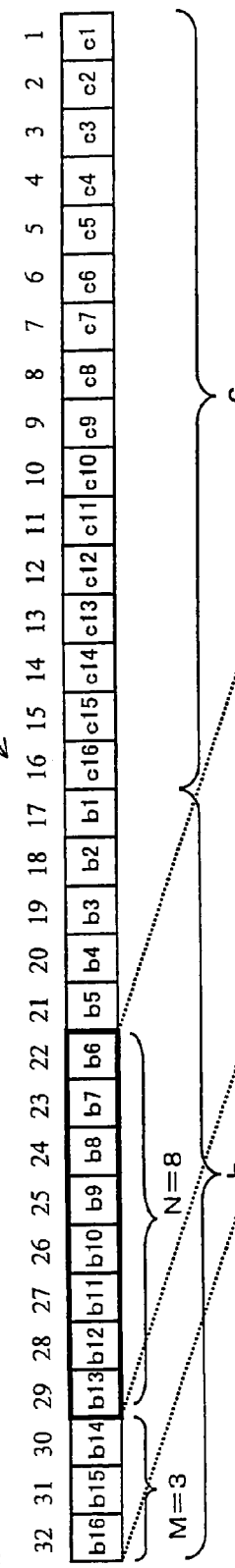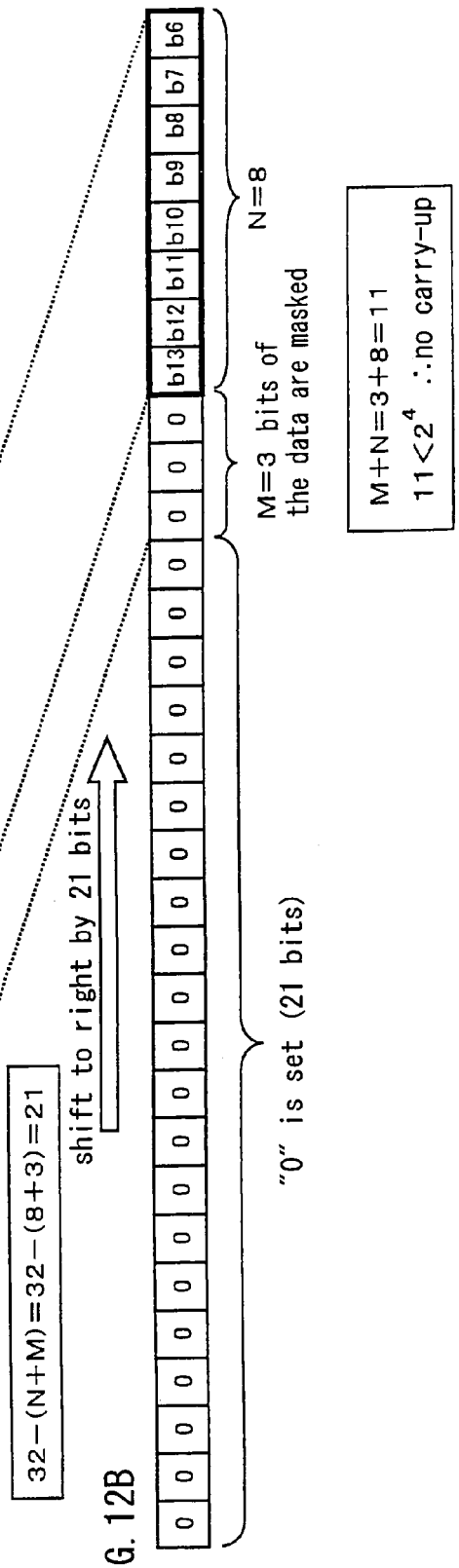

F I G. 13
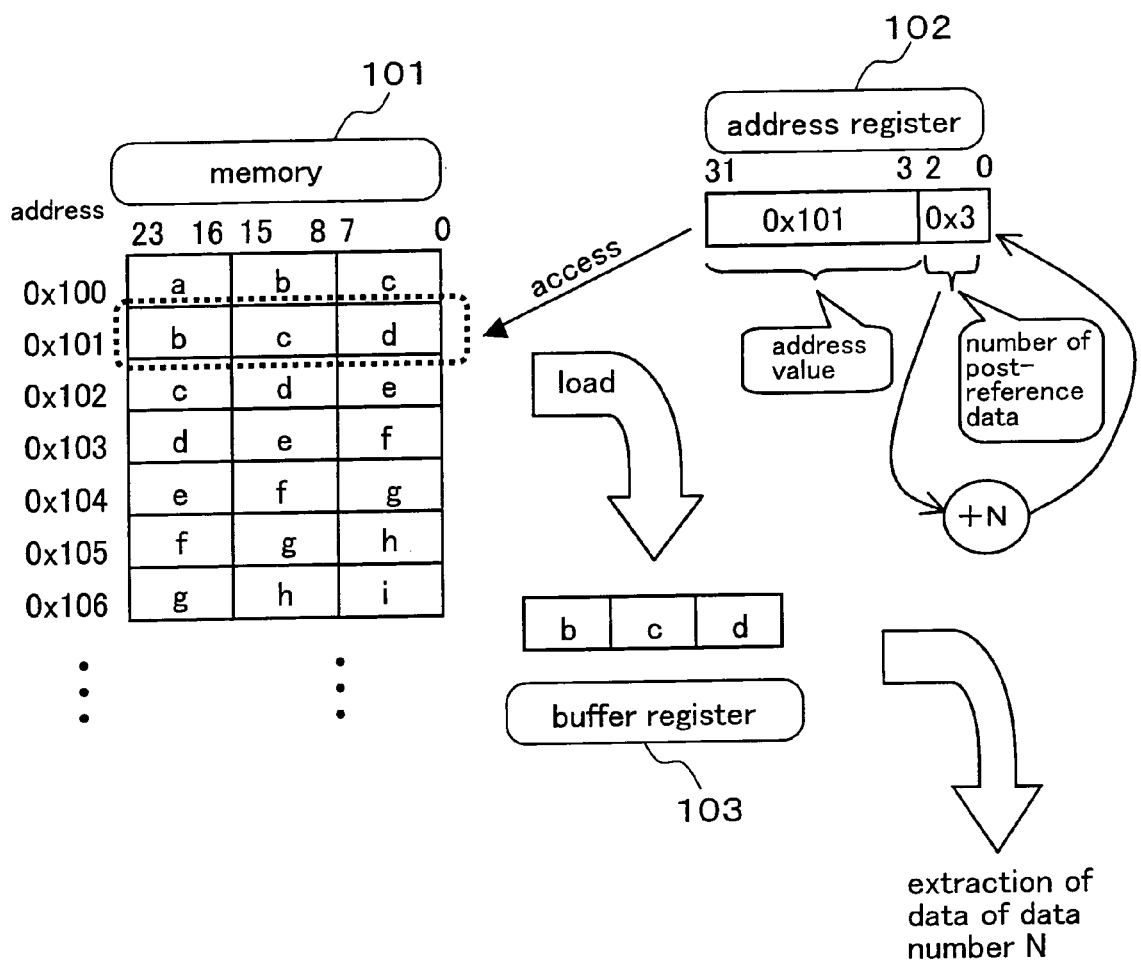

F I G. 15
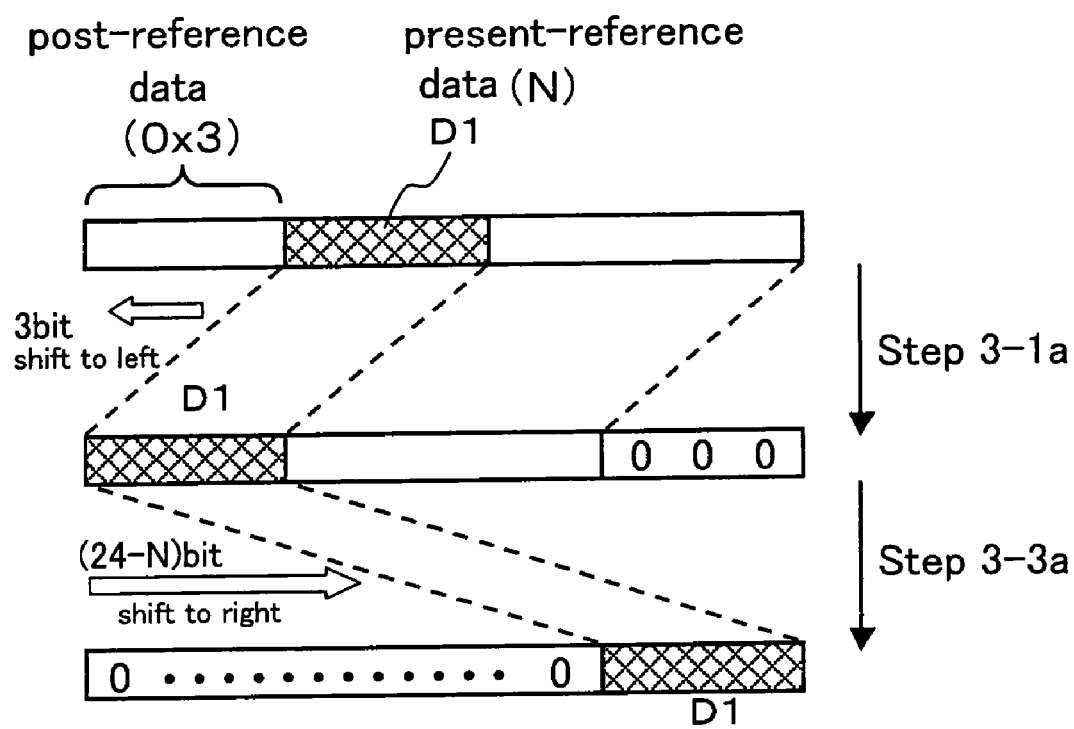

F I G. 17
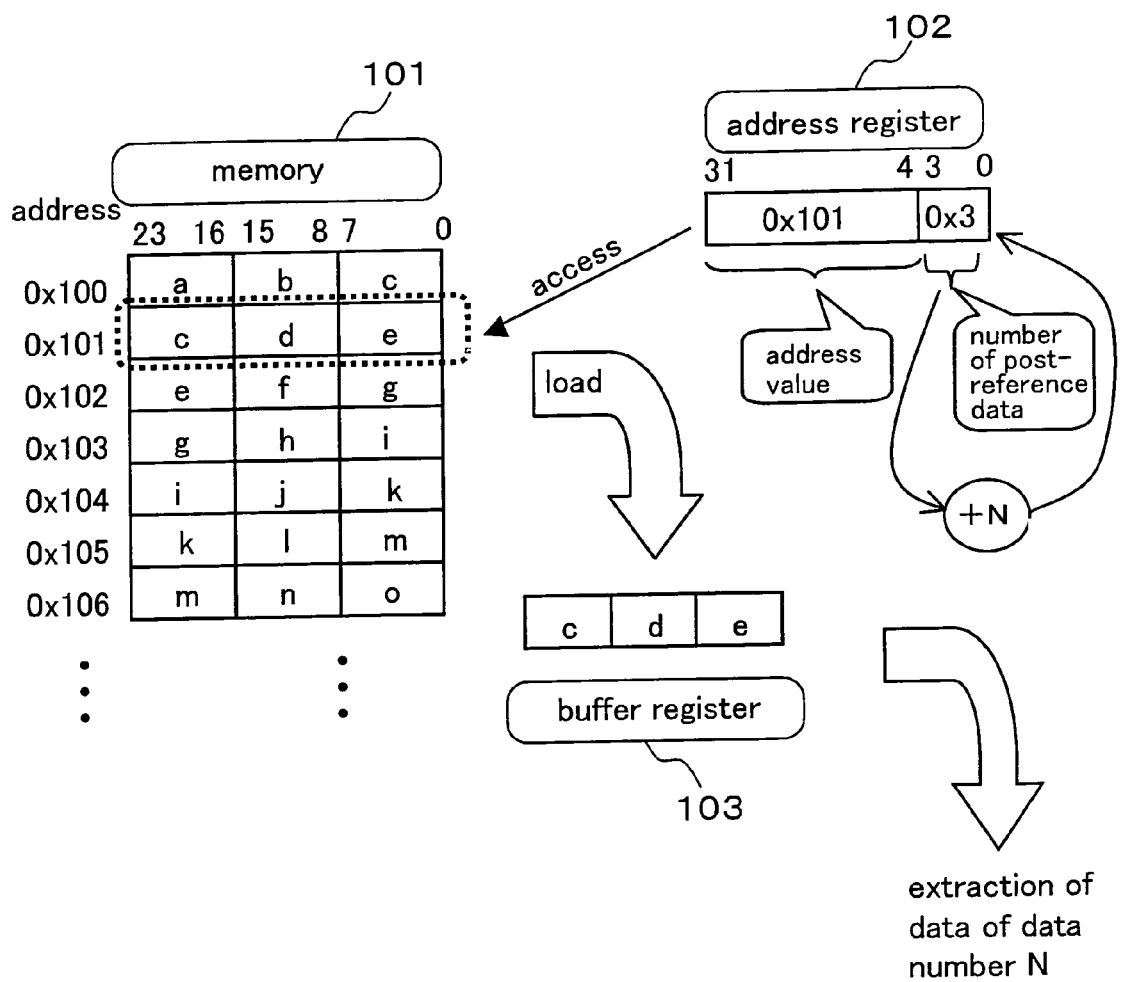

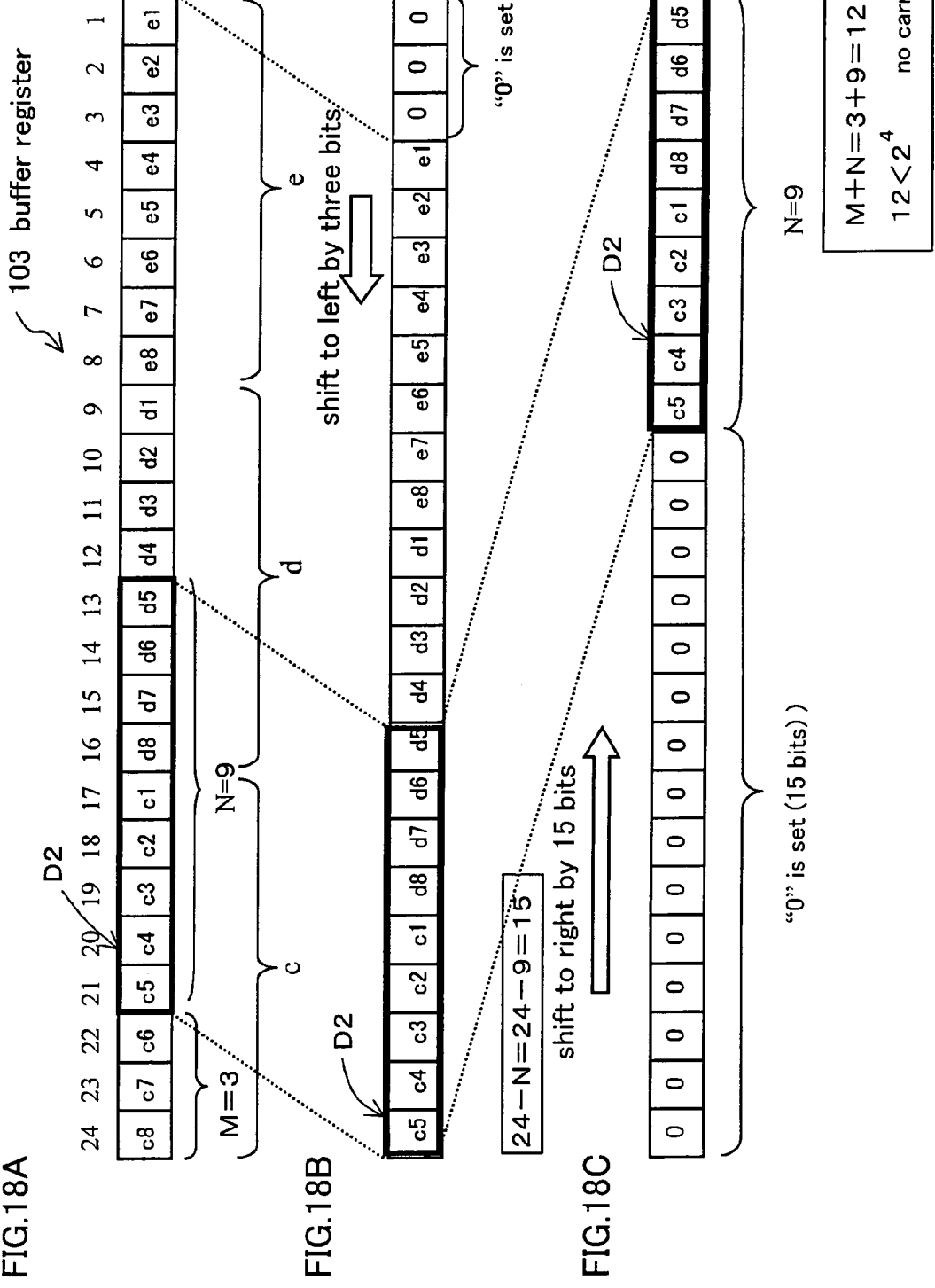

F I G. 22
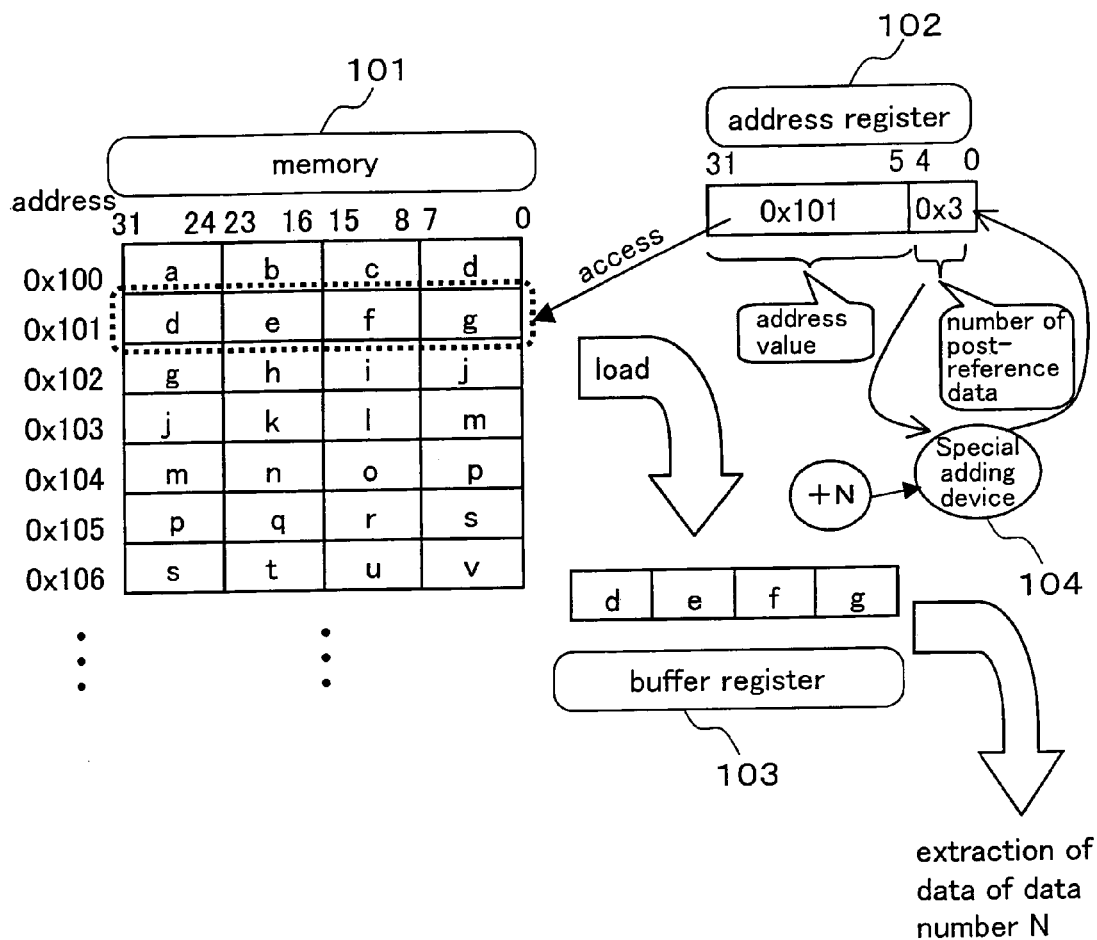

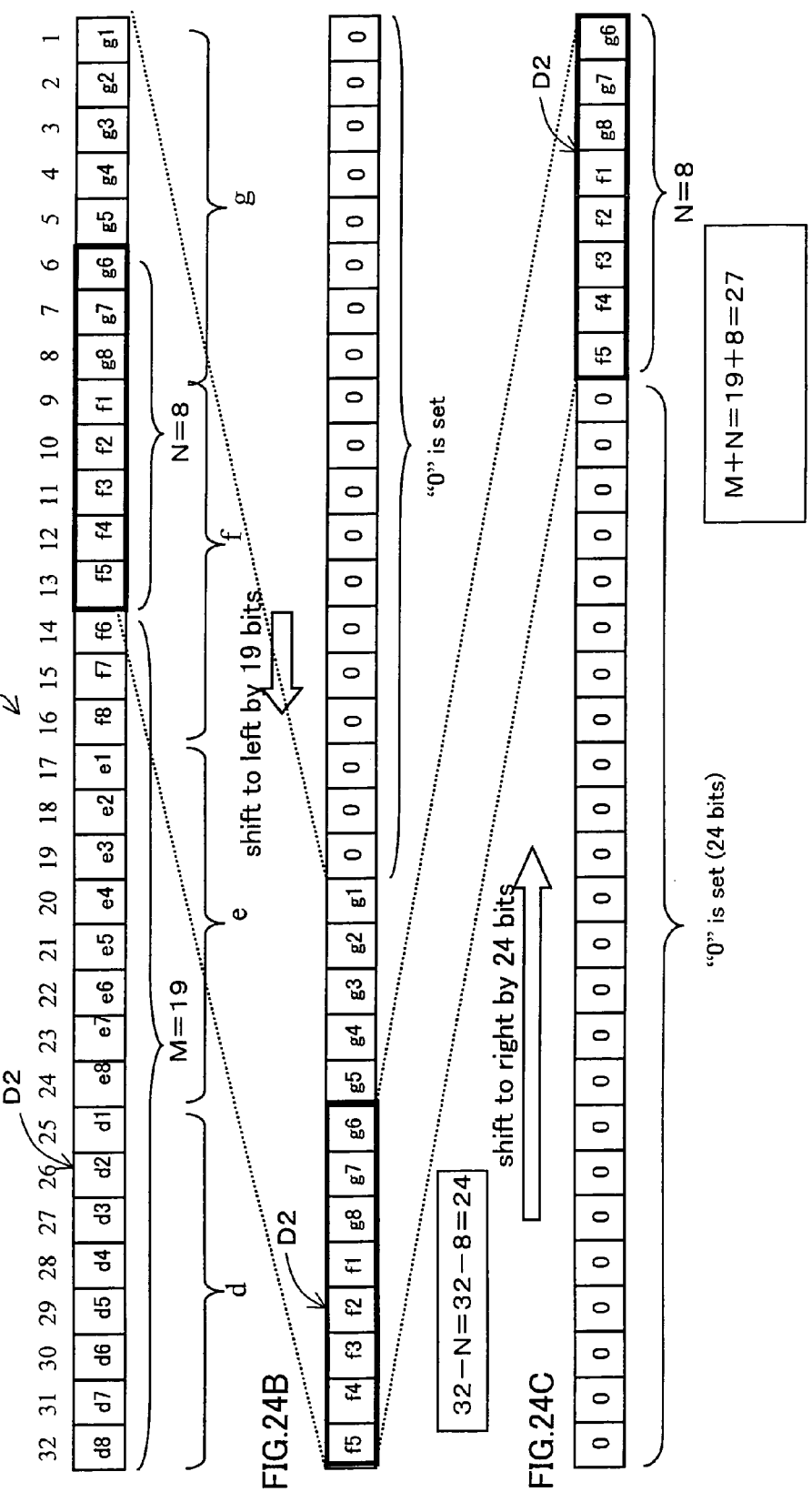

VARIABLE LENGTH DECODING DEVICE AND VARIABLE LENGTH DECODING METHOD AND REPRODUCING SYSTEM

BACKGROUND OF THE INVENTION

1. Field of the Invention

The present invention relates to a variable length decoding device and a variable length decoding method capable of accelerating a load process of a variable length code particularly from a memory in a data process for processing a variable length code used in a technical field of a processor in a broad sense.

2. Description of the Related Art

In a conventional variable decoding device, a device exclusively used for the variable length decoding is provided so as to realize a high-speed operation. Further, a decoding process is more often executed by means of software these days to respond to the ongoing improvement of a processor, wherein the high-speed operation is realized by providing an exclusive instruction for the simultaneous renewals of a data reference and a reference position thereof and the like.

In the case of the conventional method in which the exclusive device is provided to thereby achieve the high-speed operation, when a plurality of data for image coding and audio coding using a variable length code was desirably handled, for example, it was necessary to provide a device exclusively used for the purpose for each data. Further, in the high-speed operation using the software process in the processor, it was necessary to execute a judgment process in compliance with a volume of consumption data and a plurality of resultant memory accesses, which undermined an expected level of high speed. Regarding the cited patent document 1, a judgment whether or not number of data, which were referred to among data in a buffer register, exceeds a threshold value and a judgment process for a shift process of the buffer register are included in the relevant invention. Further, another memory is further provided, or the buffer register is alternatively installed as a register exclusively used for the variable length decoding so as to retain a value of the buffer register because the value is different to a data layout at a source of data loading on a memory, which required such a process as saving/returning with respect to the memory. The relevant invention further required an extra monitoring and operation in order to renew an address.

A main object of the invention is to provide a variable length decoding device, a reproducing system comprising the device and a variable length decoding method capable of accelerating the variable length decoding in the pursuit of solving the foregoing problems and thereby achieving the high-speed operation in the software process.

SUMMARY OF THE INVENTION

A first variable length decoding device according to the present invention comprises:

a memory for laying out data which is identical to data memorized on a lower-bit side at an optional address on an upper-bit side at an address subsequent to the optional address and memorizing the layed-out data;

a buffer register having a bit width at least equal to a bit width of the memory for storing data loaded from the memory; and an address register for storing a value of an accessed address (address value) with respect to the memory on an upper-bit side and storing number of data which was referred to in the buffer register on a lower-bit side, and is characterized in that a data shift operation using the number of the data which was referred to and number of data which is currently referred to is executed to the buffer register so that data to be presently referred to is extracted from the buffer register for a variable length decoding, the number of the data which was referred to on the lower-bit side of the address register is renewed by adding thereto the number of the data which has been currently referred to in response to the extraction of the data from the buffer register, the address value to be stored on the upper-bit side of the address register is maintained when the renewed number of the data which was referred to on the lower-bit side of the address register is not carried up, and the carry-up is used to renew the address value to be a next address value when the renewed number of the data is carried up.

To describe the number of the data which was referred to (post-reference data), it denotes number of bits, which were referred to, among bits constituting the data. To describe the number of the data which is/has been currently referred to (current-reference data), it denotes number of bits, which are/have been currently referred to, among the bits constituting the data. To describe the data to be presently referred to (present-reference), it denotes bits to be presently referred to among the bits constituting the data. The usage of the terms is applied to the description hereinafter.

According to the first variable length decoding device of the present invention, the access address and the number of the post-reference data are separated from the address register, the memory is accessed using the access address, the data loaded from the memory is stored in the buffer register, and the present-reference data is extracted from the buffer register. Then, the number of the data referred to when the foregoing access is made is added to the address register, and the number of the post-reference data and the access address are thereby renewed. In the foregoing manner, the present-reference data can be extracted from the buffer register based on the number of the post-reference and the number of the current-reference data. The address necessarily set in the address register in order to extract the reference-target data is also automatically renewed.

Therefore, in the case of the first variable length decoding device according to the present invention, the saving/returning process in connection with the state of the buffer register, which was demanded in the conventional technology, becomes unnecessary.

In the case of the first variable length decoding device according to the present invention, the carry-up generated at the time of the renewal of the number of the post-reference data can be used for the address renewal, and the post-reference data and the address can be thereby renewed in one renewal process achieving a reduced number of renewal processes in contrast to the conventional technology in which the renewal processes were separately demanded for the post-reference data and the address. Because of the automatic address renewal, when the process proceeds to the next address as a result of the carry-up to access the renewed address in the memory, data identical to the data on the lower-bit side at the previous address is already stored on the upper-bit side of the address, which allows the continued use.

The first variable length decoding device according to the present invention can dispense with a judgment whether or not the number of the post-reference data among the data in the buffer register exceeds a certain threshold value, a judgment process for executing a different process based on the judgment and an access to the memory based on the judgment results, which were demanded in the conventional technology, become unnecessary. Further, any extra monitoring and operation for the address renewal also become unnecessary. Accordingly, neither exclusive device nor exclusive software is required in the present invention, and no complicated operation process is demanded. In other words, the judgment process, address operation and access to the memory can be simplified, and the variable length decoding process can be thereby accelerated.

As a preferable mode of the first variable length decoding device according to the present invention, a shifter for executing a shift while masking the post-reference data can be further provided as a device for extracting the present-reference data from the buffer register. According to the preferable mode, the present-reference data can be extracted from the buffer register through such a simple improvement of the shifting function as merely masking the post-reference data, which results in the realization of the variable decoding process operated even at a higher speed.

A first variable length decoding method according to the present invention realizes the variable length decoding by using a variable length decoding device comprising:

a memory for memorizing data regarding a bit number A (integer equal to or more than two) as one word;

a buffer register having a bit width B (integer equal to or more than A) for storing the data loaded from the memory; and an address register for storing an address at which the memory is accessed on an upper-bit side and storing number of post-reference data M in the buffer register (integer equal to or more than zero) on a lower-bit side having a bit width C (integer equal to or more than one), and is characterized in including:

a first step in which a value of the access address (address value) and the number of the post-reference data M (integer equal to or more than zero) are separated from the address register;

a second step in which data identical to data memorized on a lower-bit side of a bit number D (integer represented by $A-2^C$) at an optional address is layed out on an upper-bit side of a bit number D at an address subsequent to the optional address in the memory, the memory is accessed using the access address and the data memorized in the memory is loaded into the buffer register;

a third step in which present-reference data is extracted for the variable length decoding through a data shift operation executed using the number of the post-reference data M and number of current-reference data N (integer equal to or more than one) from the buffer register; and a fourth step in which the number of the post-reference data M to be stored on the lower-bit side of the address register is renewed by adding thereto the number of the current-reference data N in response to the extraction of the present-reference data, and the address value to be stored on the upper-bit side of the address register is maintained when the renewed number of the post-reference data on the lower-bit side is not carried up and the carry-up is used to renew the address value to be a next address value when the renewed number of the data is carried up.

According to the first variable length decoding method according to the present invention, the access address and the number of the post-reference data are separated from the address register, the memory is accessed using the value of the access address (address value), the data loaded from the memory is stored in the buffer register, and the present-reference data is extracted from the buffer register. Then, the number of the data referred to when the foregoing access is made is added to the address register so that the number of the post-reference data and the address value are renewed. Thereby, the present-reference data can be extracted from the buffer register based on the number of the post-reference data and the number of the current-reference data. Further, the address to be set in the address register for the extraction of the data to be referred to can be automatically renewed. Accordingly, the saving/returning process in connection with the state of the buffer register, which was a necessary process in the conventional technology, can be omitted. In contrast to the conventional technology wherein it was necessary to carry out both of the renewal of the number of the post-reference data and the renewal of the address, the carry-up of the number of the post-reference data at the time of its renewal is used for the address renewal so that the number of the post-reference data and the address can be renewed in one renewal operation, which decreases the renewal processes. Because of the automatic address renewal, the process proceeds to the next address as a result of the carry-up to access the renewed address in the memory. Then, data, which is the same as the data on the lower-bit side at the previous address, is stored on the upper-bit side of the address, which allows the continued use.

A second variable length decoding device according to the present invention comprises:

a memory for memorizing data regarding a bit number A (integer equal to or more than two) as one word;

a buffer register having a bit width B (integer equal to or more than A) for storing the data loaded from the memory; and an address register for storing a value of an address at which the memory is accessed (address value) on an upper-bit side and storing number of post-reference data M in the buffer register (integer equal to or more than zero) on a lower-bit side having a bit width C (integer equal to or more than one), and is characterized in that data identical to data memorized on a lower-bit side of a bit number D (integer represented by $A-2^C$) at an optional address is layed out on an upper-bit side of a bit number D at an address subsequent to the optional address in the memory, and present-reference data is extracted for the variable length decoding through a data shift operation executed using the number of the post-reference data M and number of current-reference data N (integer equal to or more than one) from the buffer register, and, in response to the extraction, providing that E is an integer equal to or more than one and obtained by an operation of A–D, F and G are integers, and F is a quotient obtained by an operation of (M+N)/E with G as a remainder thereof, the quotient F is added to the upper-bit side of the address register so that the address value to be stored on the upper-bit side is renewed and the remainder G is set on the lower-bit side of the address register so that the number of the post-reference data M to be stored on the lower-bit side is renewed.

To describe the bit width mentioned above, if the lower-bit side of the address register is comprised of four bits, for example, the bit width is "four".

According to the second variable length decoding device according to the present invention, the same operation and effect as in the first variable length decoding device can be achieved. As a further effect, in response to the extraction from the buffer register, providing that E is an integer equal to or more than one obtained by the operation of A–D, F and G are integers, and F is a quotient obtained by the operation of (M+N)/E with G as a remainder thereof, the quotient F is added to the upper-bit side of the address register so that the renewal is performed on the upper-bit side, and the remainder G is set on the lower-bit side of the address register so that the renewal is performed on the lower-bit side. Therefore, the number of the post-reference data and the address can be renewed in one renewal operation as in the first variable length decoding device, and the renewal processes can be thereby reduced.

BRIEF DESCRIPTION OF THE DRAWINGS

FIG. 1 is an illustration of an exemplified configuration of a variable length decoding device according to an embodiment 1 of the present invention.

FIG. 4 is an illustration of a status of data in the data extraction according to the embodiment 1.

FIG. 5 are illustrations of an example of a specific operation according to the embodiment 1.

FIG. 6 are illustrations of an example of a specific operation according to the embodiment 1.

FIG. 7 are illustrations of an example of a specific operation according to the embodiment 1.

FIG. 12 are illustrations of an example of a specific operation according to the embodiment 2.

FIG. 13 is an illustration of an exemplified configuration of a variable length decoding device according to an embodiment 3 of the present invention.

FIG. 15 is an illustration of a status of data in the data extraction according to the embodiment 3.

FIG. 17 is an illustration of an exemplified configuration of a variable length decoding device according to an embodiment 4 of the present invention.

FIG. 18 are illustrations of an example 1 of a specific operation according to the embodiment 4.

FIG. 22 is an illustration of an exemplified configuration of a variable length decoding device according to an embodiment 6 of the present invention.

FIG. 24 are illustrations of an example 2 of the specific operation according to the embodiment 6.

DETAILED DESCRIPTION OF PREFERRED EMBODIMENTS OF THE INVENTION

Figure 2:
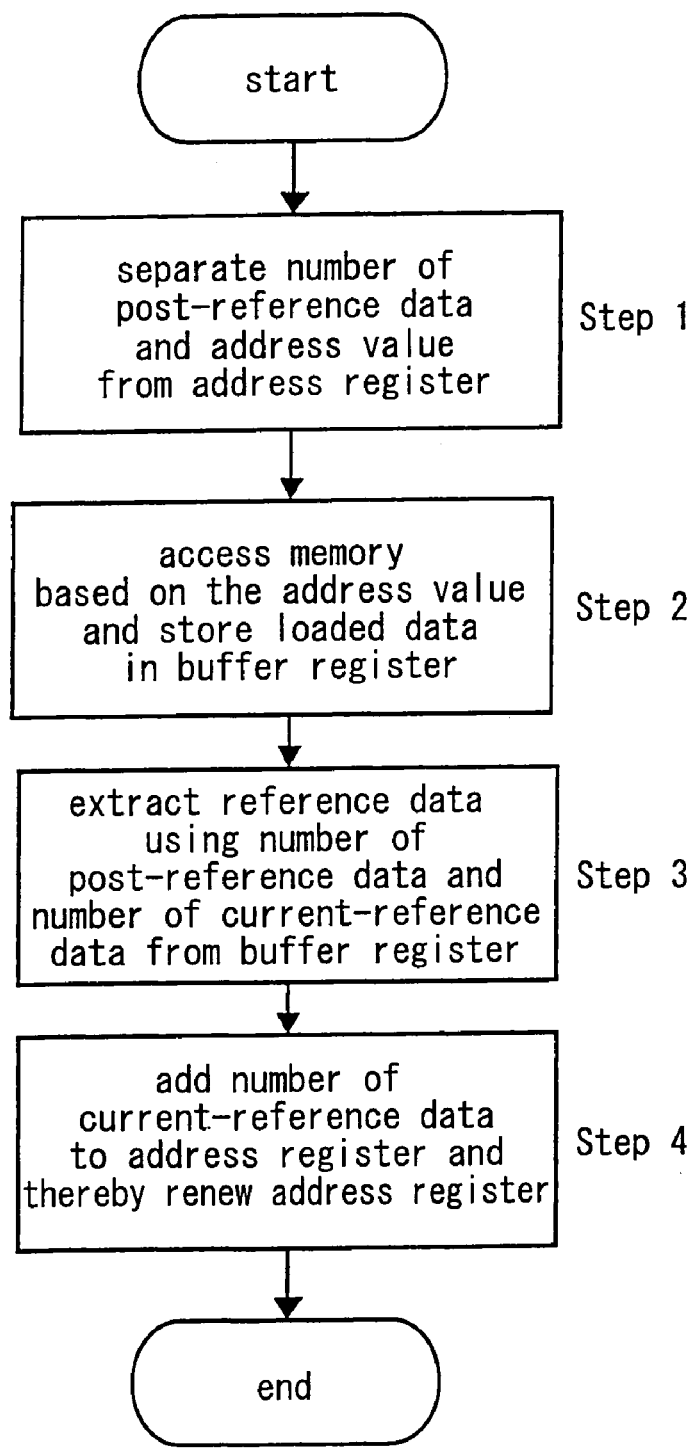
FIG. 2 is a flow chart of a process in a variable length decoding method according to the embodiment 1.

Hereinafter, a variable length decoding device and a variable length decoding method according to preferred embodiments of the present invention are described in detail referring to the drawings. Embodiments 1 through 7 relate to the variable length decoding device and the variable length decoding method.

Embodiment 1

FIG. 1 shows a variable length decoding device according to an embodiment 1 of the present invention. A reference numeral 101 in FIG. 1 denotes a memory. The memory 101 serves to memorize data, wherein a bit number A (A is an integer equal to or more than two, and A=32 in the embodiment 1) constitutes one word in the memorized data, and data, which is the same as the data memorized on a lower-bit side of a bit number D at an optional address (D is an integer equal to or more than one, and D=16 in the embodiment 1) is layed out on an upper-bit side of a bit number D at an address subsequent to the optional address.

A reference numeral 102 denotes an address register having a bit width of 32. The address register 102 has an access address (address value) on an upper-bit side (first register portion) and number of post-reference data M (M is an integer equal to or more than zero) on a lower-bit side (second register portion) having a bit width C (C is an integer equal to or more than one, and C=4 in the embodiment 1).

There is a relationship represented by $D=A-2^C$ among A, C and D. In the embodiment 1, A=32 and C=4, therefore, D=16. Between A and C, $P=2^4=16$, therefore, $A=2\times P=2\times 16=32$ providing that $A=2\times P$ and $P=2^C$.

A reference numeral 103 denotes a buffer register having a bit width B (B is an integer equal to or more than A, and B=32 in the embodiment 1). The buffer register 103 serves to retain the data loaded from the memory 101 and to extract data to be referred to through a data shift operation executed using number of post-reference data M and current-reference data N (N is number of data equal to or more than one) when present-reference data is extracted from the data loaded from the memory 101 using the access address.

As described above, the data on the memory 101 is arranged in such manner that data stored in lower 16 bits at an address is stored in upper 16 bits at an address subsequent to the address.

More specifically, data c is stored in lower 16 bits at an address number 0x101, and the same data c is stored in upper 16 bits at a next address number 0x102. Further, data d is stored in lower 16 bits at an address number 0x102, and the same data d is stored in upper 16 bits at a next address number 0x103.

Figure 3:
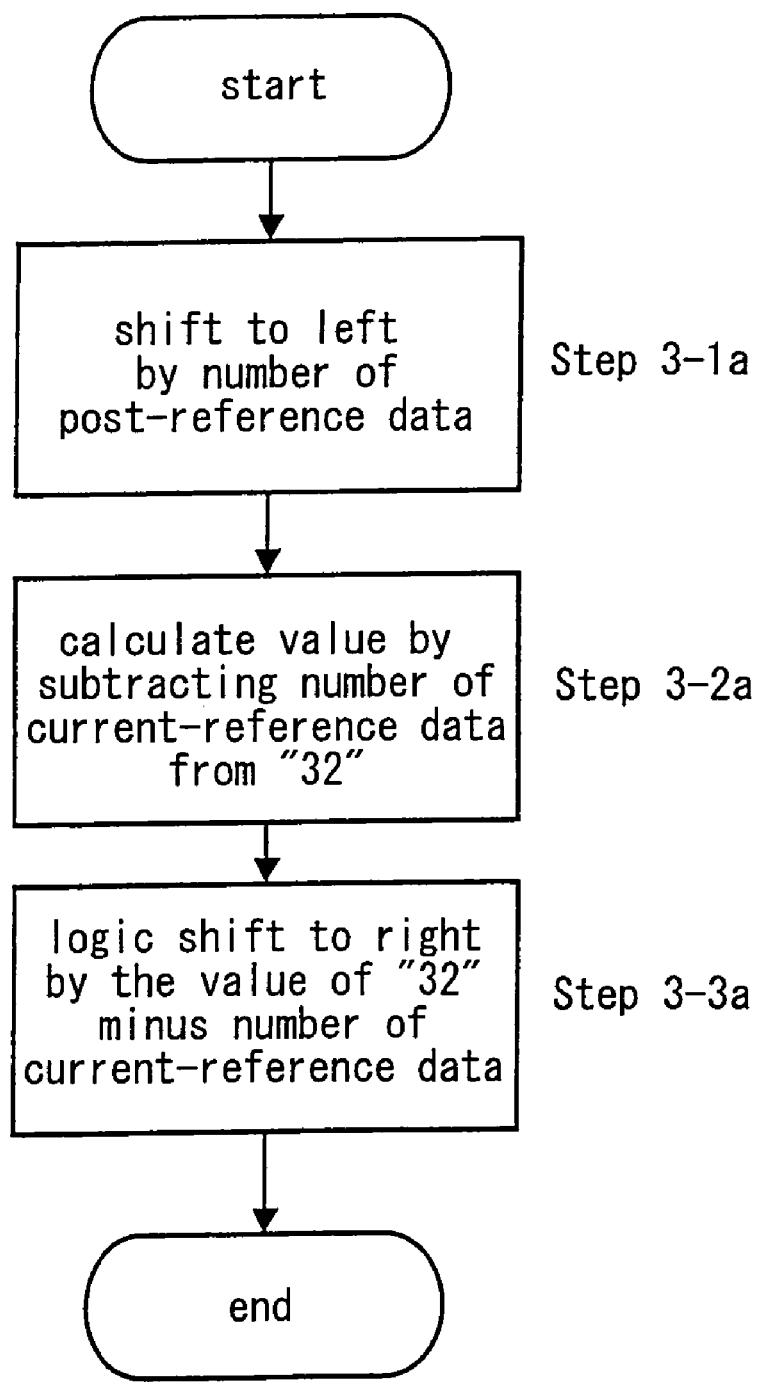
FIG. 3 is a flow chart of a data extraction according to the embodiment 1.

FIG. 2 shows a flow of a variable length decoding process using the variable length decoding device of FIG. 1. FIG. 3 shows a general process flow of extracting the present-reference data from the buffer register 103. FIG. 4 shows a state of data changing as the process flow of FIG. 3 proceeds, wherein the changes occurring in response to respective steps of FIG. 3 are shown. Steps recited in the following description correspond to the respective steps of FIGS. 2 and 3. Though a processor according to the present embodiment is described based on a 32-bit processor in order to simplify the description of the invention, the present invention is not necessarily limited to such a processor. In the memory 101, the data is stored in the order of a, b, c . . . starting at the address number 0x100 as an initial state, as shown in FIG. 1. In the address register 102, the address value is 0x101, the number of the post-reference data is 0x3, and the number of the current-reference data is N.

Hereinafter, an example of the process is described.

In Step 1, the number of the post-reference data 0x3 and the address value 0x101 are separated and extracted from the address register 102.

In Step 2, the address value 0x101 separated in the Step 1 is used to thereby access the address 0x101 in the memory 101 so that data b and c are loaded and stored in the buffer register 103.

In Step 3, the number of the post-reference data 0x3 separated in the Step 1 and the number of current-reference data N are used to thereby extract only the present-reference data from the buffer register 103 in which the data b and c are stored. A specific example of the extracting process is described in Steps 3-1a through 3-3a.

In the Step 3-1a, the data b and c stored in the buffer register 103 are shifted to left by the number of the post-reference data 0x3. A leading position of present-reference data D1 is shifted to an uppermost-bit side of the buffer register 103. In a generally available processor, "0" is usually extended where there is no data on a lower-bit side (right) when the data is shifted (see FIG. 4).

In the Step 3-2a, a value is calculated by extracting the number of the current-reference data N from "32".

In the Step 3-3a, the data shifted in the Step 3-1a is shifted to right by the value calculated in the Step 3-2a. A tail end of the present-reference data D1 is moved to a lowermost-bit side of the buffer register 103. The shift executed in the foregoing step is a logic shift. In the logic shift, "0" is usually extended where there is no data on an upper-bit side (left) (see FIG. 4).

In Step 4, the number of the current-reference data N is added to the address register 102 so that the value of the address register 102 is renewed. Then, the addition leads the number of the post-reference data to be renewed as (0x3+N) Further, the address value is automatically renewed through the carry-up from the lower-bit side on which the number of the post-reference data is retained to the upper-bit side on which the address value is retained.

For example, in the case of N=0x8, the number of the post-reference data can be represented by four bits because of 0x3+0x8=0xb, and the address value remains 0x101 with no carry-up generated. In the case of N=0xe, the number of the post-reference data is represented by five bits because of 0x3+0xe=0x11, and the address value is renewed from 0x101 to 0x102 as a result of the generated carry-up.

In the foregoing examples, "0x" denotes the hexadecimal number. "0xb" is "11" in the decimal number, which is smaller than "16" in the decimal number, that is four bits, can be represented by four bits. "0xe" is "14" in the decimal number. 0x3+0xe results in 3+14=17 in the decimal number. Therefore, the carry-up is generated in the hexadecimal number as a result of 17−16=1 to thereby produce "0x11".

A more specific example of the process is described to help the understanding.

FIG. 5A shows data loaded from the address 0x101 of the memory 101 and stored in the buffer register 103. Data b16, b15, b14, b13, b12, . . . b16, b15, . . . and b1 of 16 bits correspond to the data b of FIG. 1. Data c16, c15, . . . and c1 of 16 bits correspond to the data c of FIG. 1. The total number of the bits is 32.

It is assumed that three bits of the data b16, b15 and b14 were referred to in the previous process. Therefore, the number of the post-reference data M is three. The number of the current-reference data N is hypothetically eight here, which corresponds to the data D2 of b13, b12, . . . and b6 shown in a bold frame.

In FIG. 5B, the data row including b16, b15, . . . b1, c16, c15, . . . and c1 of 32 bits is shifted to left by the number of the post-reference data M=3 bits, and the data row b13, b12, . . . b1, c16, c15, . . . and c1 from the uppermost bit is stored, while the lower three bits are set to "0". A leading position of the bold frame corresponds to the 32nd bit.

FIG. 5C shows a state in which the data row including b13, b12, . . . b1, c16, c15, . . . c1, 0, 0 and 0 of 32 bits is shifted to right by 24 bits and "0" is set in 24 bits from the uppermost bit. The 24 bits, by which the data row is shifted to right, is the result of subtracting the number of the current-reference data N=8 from "32". A tail end of the bold frame corresponds to the first bit. More specifically, b13, b12, . . . and b6 of the data D2 is stored in eight bits from the lowermost bit in the buffer register 103, which means that the present-reference data D2 has been extracted.

The addition of the number of the current-reference data N to the number of the post-reference data M is represented by M+N=3+8=11, and the number of the post-reference data M is accordingly renewed from "3" to "11" in the address register 102. There is no carry-up of the address value because "11" is below $2^4$ (four bits), and the initial address value 0x101 is maintained.

A process that follows the process of FIG. 5 is described referring to FIG. 6.

FIG. 6A shows a state in which the data at the address 0x101 of the memory 101 is loaded into the buffer register 103 (same as FIG. 5A).

11 bits of the data b16, b15, b14, b13, b12, . . . and b6 were referred to in the process so far, and the number of the post-reference data M is now 11. The number of the current-reference data N is hypothetically five here, which corresponds to data D3 of b5, b4, . . . b1 emphasized by the bold frame.

FIG. 6b shows a state in which the data row including b16, b15, . . . b1, c16, c15, . . . and c1 of 32 bits is shifted to left by the number of the post-reference M=11 bits, and the data row of b5, b4, . . . b1, c16, c15, . . . and c1 from the uppermost bit is stored, while "0" is set in the lower 11 bits. A leading position of the bold frame corresponds to the 32nd bit.

FIG. 6c shows a state in which the data row including b5, b4, . . . b1, c16, c15, . . . c1, 0, 0, . . . and 0 of 32 bits is shifted to right by 27 bits, and "0" is set in 27 bits from the uppermost bit. The 27 bits, by which the data row is shifted to right, is obtained by subtracting the number of the current-reference data N=5 from "32". A tail end of the bold frame corresponds to the first bit. More specifically, b5, b4, . . . and b1 of the data D3 is stored in five bits from the lowermost bit of the buffer register 103, which means that the present-reference data D3 to has been extracted.

The addition of the number of the current-reference data N to the number of the post-reference data M is represented by M+N=11+5=16, and the number of the post-reference data M is accordingly renewed from "11" to "16" in the address register 102. The address value is carried up because "16" falls into the range of equal to or more than $2^4$ (four bits) and renewed to be the next address value 0x102. More specifically, the process proceeds to the next address because the reference of the data for all of 16 bits constituting the data B has been completed.

When the number of the current-reference data N is hypothetically equal to or below four in the process of FIG. 6, the logic process, which is the same as shown in FIG. 5, is repeated.

A process that follows the process of FIG. 5 is described referring to FIG. 7. In the process, the number of the current-reference data N is equal to or more than six.

FIG. 7A shows a state in which the data of the address 0x101 in the memory 101 is loaded into the buffer register 103 (same as in FIG. 5A).

11 bits of the data b16, b15, b14, b13, b12, . . . and b6 were referred to in the process so far, and the number of the post-reference data M is 11. The number of the current-reference data N is now hypothetically seven here, which corresponds to data D4 of b5, b4, . . . b1, c16, and c15. In the present case, the data is increased by two bits than in the case of FIG. 6B, in which not only the data b but also a part of the data c is included. The relevant data is emphasized using the bold frame.

FIG. 7b shows a state in which the data row including b16, b15, . . . b1, c16, c15, . . . and c1 of 32 bits is shifted to left by the number of the post-reference data M=11 bits, and the data row of b5, b4, . . . b1, c16, c15 . . . and c1 from the uppermost bit is stored, while "0" is set in the lower 11 bits, in the same manner as in FIG. 6B. A leading position of the bold frame corresponds to the 32nd bit.

FIG. 7C shows a state in which the data row including b5, b4, . . . b1, c16, c15 . . . c1, 0, 0, . . . and 0 of 32 bits is shifted to right by 25 bits, and "0" is set in 25 bits from the uppermost bit. The 25 bits, by which the data row is shifted to right, is obtained by subtracting the number of the current-reference data N=7 from "32". The bit number is fewer than in the case of FIG. 6C by two bits. A tail end of the bold frame corresponds to the first bit. More specifically, b5, b4, . . . b1, c16 and c15 of the data D4 is stored in seven bits from the lowermost bit in the buffer register 103, meaning that the present-reference data D4 has been extracted.

The addition of the current-reference data N to the number of the post-reference data M results in M+N=11+7=18, and the number of the post-reference data M is renewed from "11" to "18" in the address register 102. The address value is carried up because "18" falls into the range of equal to or more than $2^4$ (four bits) and renewed to be the next address value 0x102. More specifically, the process proceeds to the next address because the reference of the data for all of 16 bits constituting the data B has been completed and the reference of the data C has commenced. "18", which is the number of the post-reference data M, is "0x12" in the hexadecimal number, and 0b10010 in the binary number, while the lower four bits except for the 5th bit of the carry-up result in "0b0010" and 0x2" in the hexadecimal number. This corresponds to that the reference of the two upper bits of the data C, c16 and c15, have been completed.

Figure 8:
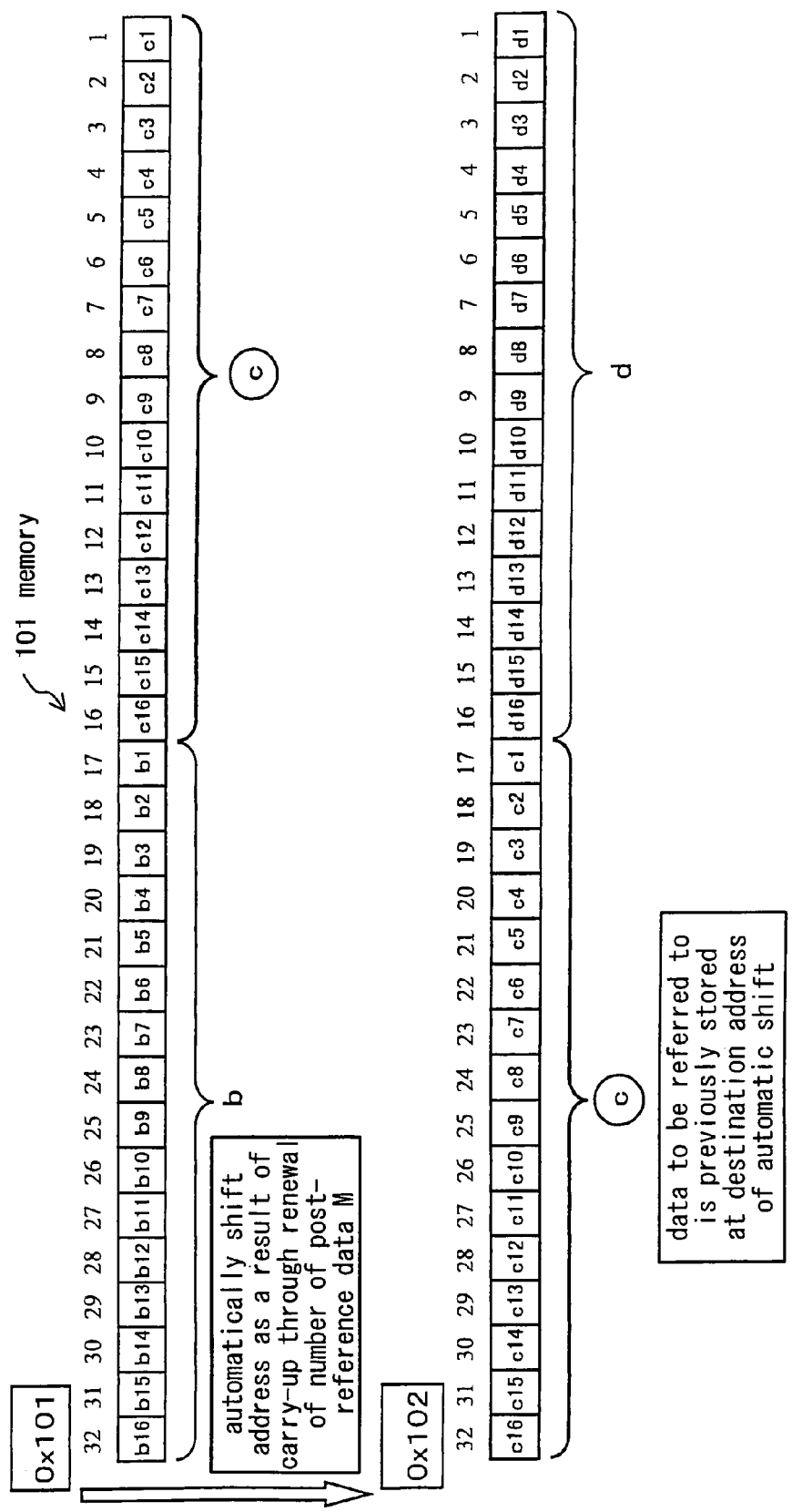
FIG. 8 is an illustration of an example of a specific operation according to the embodiment 1.

As shown in FIG. 8, when the process proceeds from the address 0x101 to the next address 0x102, data which is the same as the data c (c16, c15, . . . and c1) for the lower-side 16 bits at the previous address 0x101 is already stored in the upper 16 bits, which allows the continued use. Further, no extra monitoring and operation for the address renewal is necessary.

The address register 102 and the buffer register 103 in FIG. 1, which do not perform any special operation, do not require any exclusive register and can be realized using a general-purpose register generally used for a processor. However, in the same manner as in the access address, the number of the post-reference data and the like according to the conventional technology, the value of the address register 102 is necessary subjected to the saving/returning with respect to a blank space in the memory 101 or the like.

In the example shown in the embodiment 1, the data in the lower 16 bits is also arranged in the upper 16 bits at the next address. Therefore, the data of at least 17 bits resulting from 16 bits + one bit can be extracted at a time. Further, a memory capacity twice as large in comparison to the case of jamming data is required.

Embodiment 2

Hereinafter, a variable length decoding device and a variable length decoding method according to an embodiment 2 of the present invention are described referring to the drawings.

Figure 9:
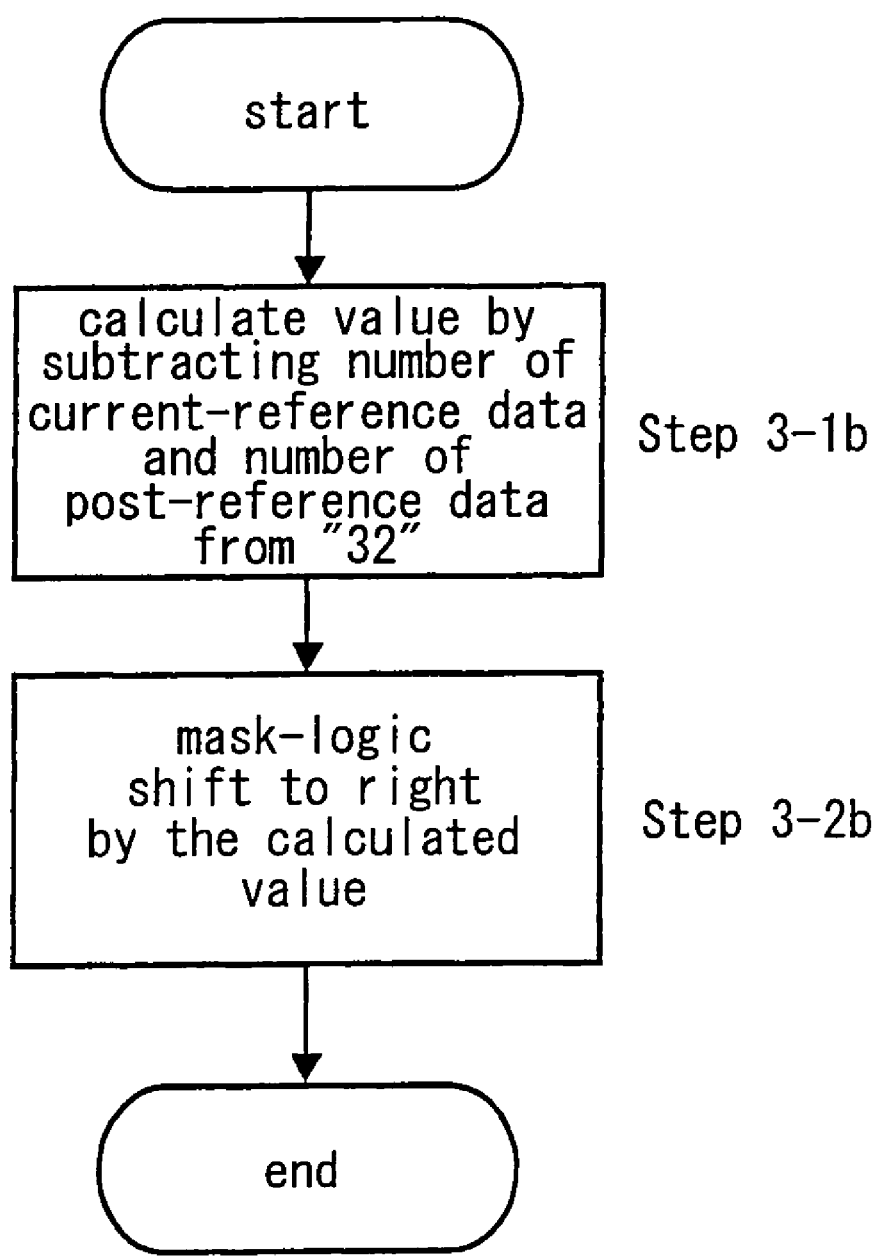
FIG. 9 is a flow chart of a data extraction according to an embodiment 2 of the present invention.
Figure 10:
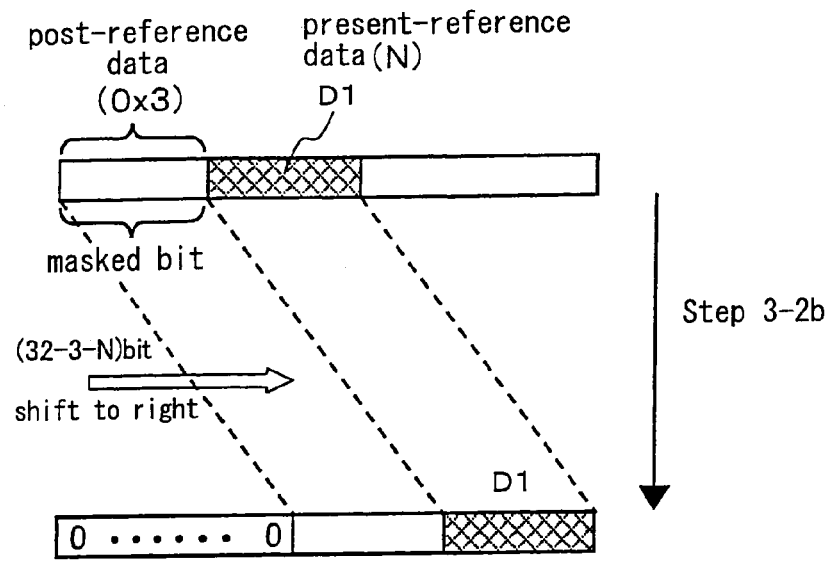
FIG. 10 is an illustration of a status of data in the data extraction according to the embodiment 2.

FIG. 9 shows a process flow of extracting the present-reference data from the buffer register 103 according to the embodiment 2. FIG. 10 shows a state of data changing as the process flow of FIG. 9 proceeds, wherein the change occurs in response to respective steps of FIG. 9.

Figure 11:
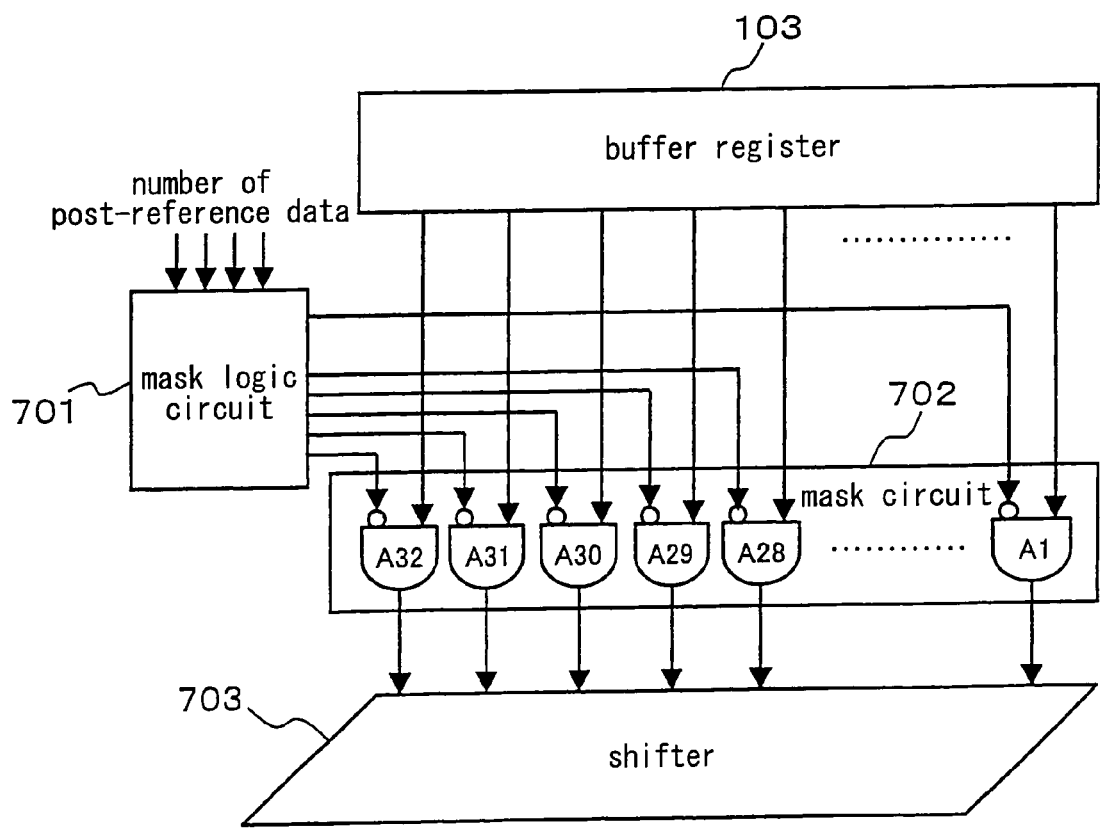
FIG. 11 is an illustration of an exemplified configuration of a circuit showing a periphery of a shifter and a buffer register according to the embodiment 2.

FIG. 11 is a view of an exemplified configuration of a circuit showing a periphery of a shifter and a buffer register used in the embodiment 2.

Referring to reference numerals shown in FIG. 11, 701 denotes a mask logic circuit for masking a part of bits retained by the buffer register 103, 702 denotes a mask circuit for masking data inputted to the shifter in response to an output of the mask logic circuit 701, and 703 denotes the shifter for executing a shift.

FIGS. 1 and 2 are incorporated in the embodiment 2 by reference.

FIGS. 1, 2, 9, 10 and 11 are used for the description. The following description is based on a 32-bit processor in order to simplify the description, however, the present invention is not necessarily limited thereto. In the memory 101, the data is stored in the order of a, b, c . . . starting at the address number 0x100 as an initial state, as shown in the drawing. In the address register 102, the address value is 0x101, the number of the post-reference data is 0x3, and the number of the current-reference data is N.

A basic operation according to the present embodiment is identical to the illustration of FIG. 2 and description of the embodiment 1. The present embodiment is characterized in that Step 3 of FIG. 2 is developed as shown in FIG. 9.

Below is described an example of the process.

In Step 1, the number of the post-reference data 0x3 and the address value 0x101 are separated and extracted from the address register 102.

In Step 2, the address value 0x101 separated in the Step 1 is used to access the address number 0x101 in the memory 101, and the data b and c are thereby loaded and stored in the buffer register 103.

In Step 3, the number of the post-reference data 0x3 separated in the Step 1 and the number of the current-reference data N are used to extract only the present-reference data from the buffer register 103 where the data b and c are stored. A specific flow of the extraction is shown in Steps 3-1b through 3-2b.

In the Step 3-1b, a value is calculated by subtracting a total of the number of the post-reference data 0x3 and the number of the current-reference data N from "32". In the embodiment 1, only the number of the current-reference data N is subtracted from "32". Further, a process, which corresponds to "the data b and c stored in the buffer register 103 are shifted to left by the number of the post-reference data 0x3" recited in the Step 3-1a of the embodiment 1, is not executed because such a process is covered by the mask circuit in the present embodiment.

In the Step 3-2b, the data is shifted to right by "32−(0x3+N)", which is the value calculated in the Step 3-1b, while the data is simultaneously masked using the mask logic circuit 701, the mask circuit 702 and the shifter 703 shown in FIG. 11. A tail end of the present-reference data D1 is directly moved to the lowermost-bit side of the buffer register 103. The foregoing shift is the logic shift (see FIG. 10).

In Step 4, the number of the current-reference data N is added to the address register 102 to thereby renew the value of the address register 102. In the renewal process, in the same manner as in the embodiment 1, the number of the post-reference data is renewed to be (0x3+N) as a result of the foregoing addition, and the address value is also automatically renewed as a result of the carry-up from the lower-bit side on which the number of the post-reference data is retained to the upper-bit side on which the address value is retained.

Any step other than the Steps 3-1B and 3-2B serving as the specific process of the Step 3 is the same as in the embodiment 1.

In the foregoing description, when the number of the post-reference data represented by four bits is 0x3, the mask logic circuit 701 outputs mask signals to three upper AND gates A32, A31 and A30 in the mask circuit 702. The three AND gates A32, A31 and A30 alone are thereby rendered non-conductive, while other AND gates A29–A1 are conductive. The data of 32 bits in the buffer register 103 is transferred to the shifter 703 in a state in which upper three bits of the data are masked (in a state in which they are forcibly set to "0"). The shifter 703, as shown in FIG. 12, shifts the 32-bit data whose upper three bits are masked to right by 21 bits. The 21 bits is obtained by subtracting "11", which results from the addition of the number of the post-reference data M=3 and the number of the current-reference data N=8, from "32".

Below is shown a table of a conversion logic assumed in the mask logic circuit 701 configured as illustrated in FIG. 11.

TABLE 1

| Number of post-reference data | Output of conversion logic |
|---|---|
| 0 × 0 | 0b000 |
| 0 × 1 | 0b001 |
| 0 × 2 | 0b011 |
| 0 × 3 | 0b111 |

A method of circuit packaging for the mask logic circuit 701 and the mask circuit 702 shown in FIG. 11 is not particularly defined leaving any option for the circuit packaging available. Separate logics or a collective logic can be provided for the mask logic circuit 701 and the mask circuit 702.

Embodiment 3

FIGS. 13 through 16 show a variable length decoding device according to an embodiment 3 of the present invention.

A processor according to the embodiment 3 is described based on a 24-bit processor in order to simplify the description, however, the present invention is not limited thereto.

In FIG. 13, the memory 101 memorizes data in which 24 bits constitute one word, and each address comprises upper eight bits, intermediate eight bits and lower eight bits. Data identical to data in intermediate bits of an address is layed out on an upper-bit side of a next address, and data identical to data on a lower-bit side of an address is layed out in intermediate bits of a next address. The 16 bits of the intermediate eight bits and the lower eight bits can be collectively called the lower-bit side in contrast to the upper eight bits.

The address register 102 is a register having a bit width of 24 and comprised of an upper-bit side (first register portion) for retaining the address value and a lower-bit side (second register portion) having a bit width of C (C=3 in the embodiment 3) for retaining the post-reference data M.

The buffer register 103 is a buffer register having a bit width B (B=24 in the embodiment 3) for retaining the data load from the memory 101.

A bit width A of the memory 101 is 24, the bit width C of the second register portion of the address register 102 is three, and a bit number D on the lower-bit side of the memory 101 is eight. There is a relationship represented by $D=A-2^C$ among A, C and D. In the embodiment 2, A=24 and C=3, therefore, D=16. There is a relationship represented by $A=3 \times P$ between A and C providing that $P=2^C$. Because $P=2^3=8$, $A=3 \times P=3 \times 8=24$.

Figure 14:
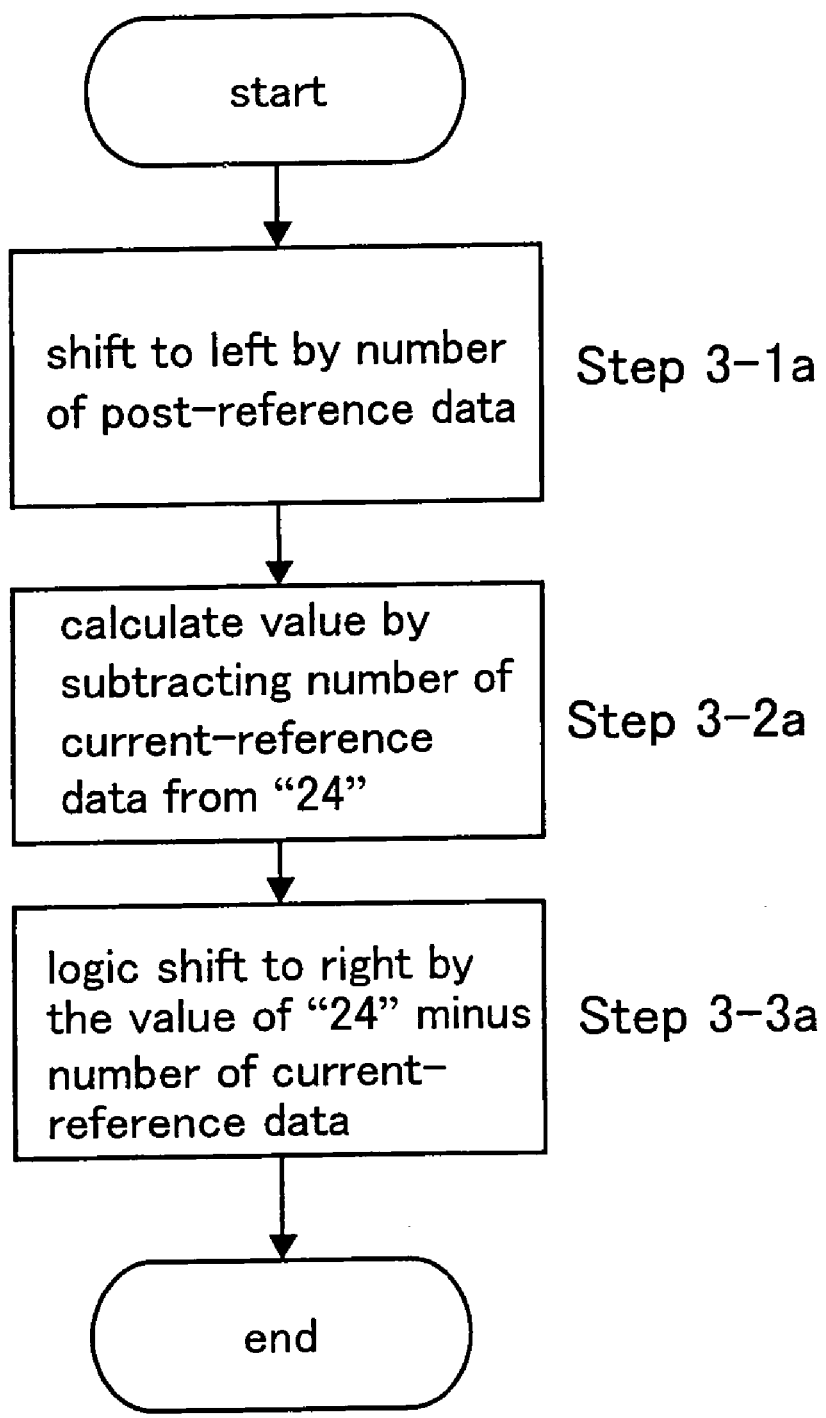
FIG. 14 is a flow chart of a data extraction according to the embodiment 3.

Referring to FIGS. 2, 14 and 15, a conventional process of extracting the present-reference data from the buffer register 103 is described. FIG. 14 shows a flow of the process, and FIG. 15 shows a state of data changing as the process flow of FIG. 14 proceeds. Steps in the following description correspond to respective steps shown in FIGS. 2 and 14. As shown in the drawing, it is assumed that the data is stored in the memory 101 in the order of a, b, c . . . starting at the address number of 0x100 as an initial state. In the address register 102, the address value is 0x101, the number of the post-reference data is 0x3, and the number of the current-reference data is N.

Below is described an example of the process.

In Step 1, the number of the post-reference data 0x3 and the address value 0x101 are separated and extracted from the address register 102.

In Step 2, the address value 0x101 separated in the Step 1 is used to access the address number 0x101 in the memory 101 so that data b, c and d are loaded and stored in the buffer register 103.

In Step 3, the number of the post-reference data 0x3 separated in the Step 1 and the number of the current-reference data N are used to extract only the present-reference data from the buffer register 103 where the data b, c and d are stored. An example of a specific extraction process is described in Steps 3-1a through 3-3a.

In the Step 3-1a, the data b, c and d stored in the buffer register 103 are shifted to left by the number of the post-reference data 0x3. A leading position of the present-reference data D1 is moved to the uppermost-bit side of the buffer register 103. In a general processor, "0" is usually extended where there is no data on the lower-bit side (right) when the data is shifted as described (see FIG. 15).

In the Step 3-2a, a value is calculated by subtracting the number of the current-reference data N from "24".

In the Step 3-3a, the data shifted in the Step 3-1a is shifted to right by the value calculated in the Step 3-2a. A tail end of the present-reference data D1 is moved to the lowermost-bit side of the buffer register 103. The shift executed above is the logic shift. "0" is generally extended where there is no data on the upper-bit side (left) when the data is shifted as described (see FIG. 15).

In Step 4, the number of the current-reference data N is added to the address register 102 so that the value of the address register 102 is renewed. The foregoing addition leads the number of the post-reference data to be renewed as (0x3+N). Further, the address value is also automatically renewed as a result of the carry-up from the lower-bit side on which the number of the post-reference data is retained to the upper-bit side on which the address value is retained.

For example, in the case of N=0x2, the number of the post-reference data can be represented by three bits in 0x3+0x2=0x5, and the address value remains 0x101 with no carry-up. In the case of N=0x8, the number of the post-reference data is represented by four bits in 0x3+0x8=0xb, and the address value is renewed from 0x101 to 0x102 as a result of the generated carry-up. In the case of N=0xf, the number of the post-reference data is represented by five bits in 0x3+0xf=0x12. Accordingly, two carry-ups are generated and the address value is thereby renewed from 0x101 to 0x103.

A more specific example is given below to enhance the understanding of the process.

Figure 16A:
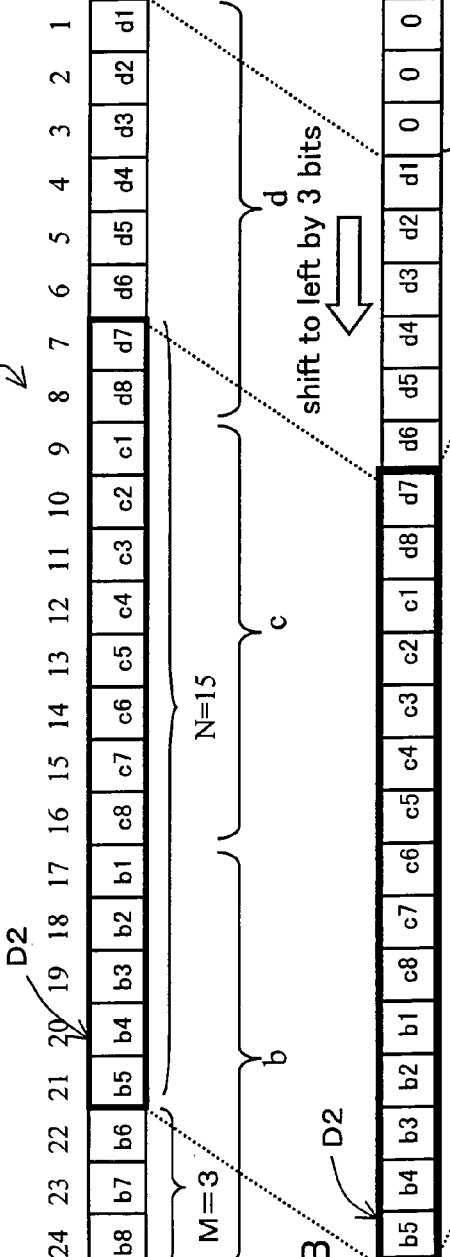
FIG. 16 are illustrations of an example of a specific operation according to the embodiment 3.

FIG. 16A shows data loaded from the address number 0x101 of the memory 101 and stored in the buffer register 103. Data b8, b7, b6, . . . and b1 of eight bits correspond to the data b of FIG. 13. Data c8, c7, . . . and c1 of eight bits correspond to the data c of FIG. 13. Data d8, d7, . . . and d1 of eight bits correspond to the data d of FIG. 13. A summed number of the bits is 24.

It is assumed that three bits of the data b8, b7 and b6 were subjected to the reference in the previous process. Therefore, the number of the post-reference data M is three. The number of the current-reference data N is hypothetically 15 here, which corresponds to the data D2 of b5, . . . b1, c8, c7, . . . , c1, d8 and d7 emphasized by the bold frame.

Figure 16B:
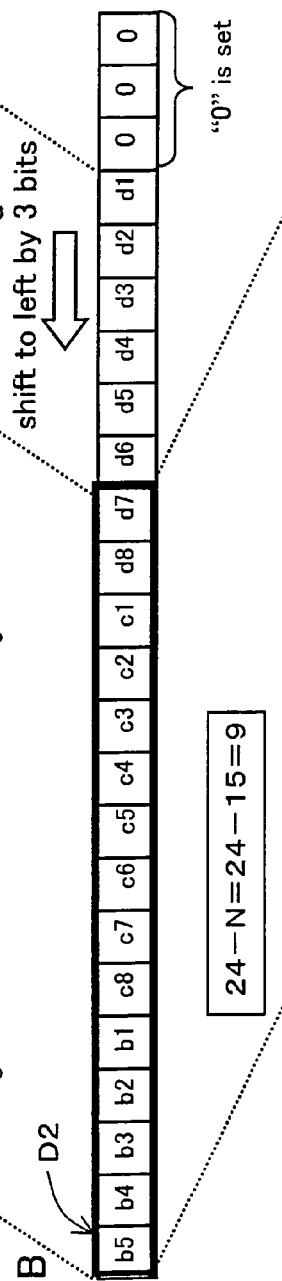

In FIG. 16B, the data row of 24 bits including b8, b7, . . . b1, c8, c7, . . . c1, d8, d7, . . . and d1 is shifted to left by the number of the post-reference data M=3 bits, and the data row of b5, . . . b1, c8, c7, . . . c1, d8, d7, . . . and d1 from the uppermost bit is stored, while "0" set in the lower three bits. A leading position of the bold frame corresponds to the 24th bit.

Figure 16C:
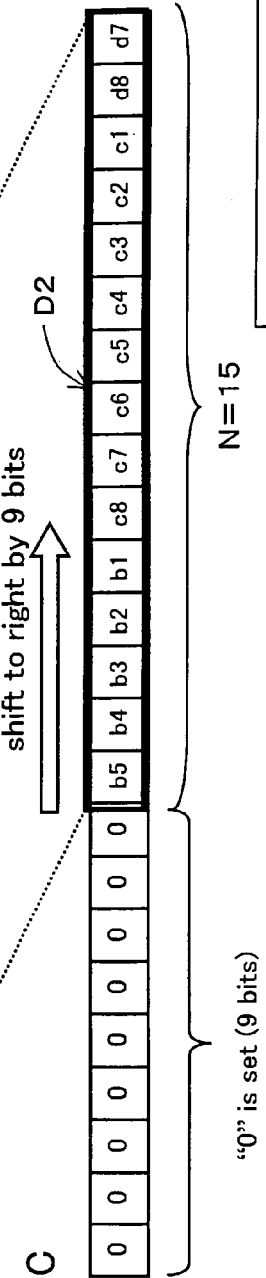

In FIG. 16C, the data row of 24 bits including b5, . . . b1, c8, c7, . . . c1, d8, d7, . . . d1, 0, 0 and 0 is shifted to right by nine bits with "0" set in nine bits from the uppermost bit. The nine bits, which is the amount of the shift to right, is obtained from subtracting the number of the current-reference data N=15 from "24". A tail end of the bold frame corresponds to the first bit. More specifically, b5, . . . b1, c8, c7, . . . c1, d8 and d7 of the data D2 are stored in 15 bits from the uppermost bit of the buffer register 103, meaning that the present-reference data D2 has been extracted.

When the number of the current-reference data N is added to the number of the post-reference data M, M+N=3+15=18 is obtained. Accordingly, the number of the post-reference data M is renewed from "3" to "18" in the address register 102. Since "18" falls into the range of equal to or more than 2x2³ (four bits), two carry-ups of the address value are implemented to thereby renew the address value to 0x103. This means that the process goes to two addresses ahead because the reference of the data in all of eight bits constituting the data b and the reference of the data in all of eight bits constituting the data c have been completed, and the reference of the data d has commenced. The number of the post-reference data M, "18", is "0x12" in the hexadecimal number and "0b10002" in the binary number, however, is "0b0002" in the lower four bits except for the fifth bit of the carry-up and "0x2" in the hexadecimal number. This corresponds to that the upper two bits e16 and e15 have been referred to.

As shown in FIG. 13, data identical to the data d (d8, d7, . . . and d1) in the lower-side eight bits at the address number 0x101, which is two addresses back, is already stored in the upper eight bits of the address 0x103, allowing the continued use. Any extra monitoring and operation for the address renewal is not necessary.

In the example shown in the embodiment 3, the data of the lower 16 bits is also layed out in the upper 16 bits at the next address, therefore, at least the data of 17 bits resulting from 16 bits + one bit can be extracted at a time. Further, a memory capacity three times as large in comparison to the case of jamming data is required.

The address register 102 and the buffer register 103 in FIG. 13, which do not perform any special operation, does not require any exclusive register and can be realized using a general-purpose register generally used for a processor. However, in the same manner as in the access address, the number of the post-reference data and the like according to the conventional technology, the value of the address register 102 is necessary subjected to the saving/returning with respect to a blank space in the memory 101 or the like.

Embodiment 4

A variable length decoding device according to an embodiment 4 of the present invention is described referring to FIGS. 17 through 19. Though a processor according to the embodiment 4 is described based on a 24-bit processor, the present invention is not necessarily limited to such a processor.

In FIG. 17, the memory 101 memorizes data in which 24 bits constitute one word, and each address comprises upper eight bits, intermediate eight bits and lower eight bits. Data identical to data on a lower-bit side of an address is layed out on an upper-bit side of a next address.

The address register 102 is a register having a bit width of 32 and comprised of an upper-bit side (first register portion) for retaining an address value and a lower-bit side (second register portion) having a bit width C (C=4 in the embodiment 4) for retaining the number of the post-reference data M.

The buffer register 103 is a register having a bit width B (B=24 in the embodiment 4) for retaining the data loaded from the memory 101.

A bit width A of the memory 101 is 24, the bit width C of the second register portion of the address register 102 is four, and a bit number D on the lower-bit side of the memory 101 is eight. There is a relationship represented by $D=A-2^C$ among A, C and D. Three is a relationship represented by $A=(3/2)\times P$ between A and C providing that $P=2^C$. Because $P=2^4=16$, $A=(3/2)\times 16=24$ is obtained.

In the variable length decoding device according to the embodiment 4, a process flow of the variable length decoding conforms to the process flow described in the embodiment 1 (FIG. 2).

In the embodiment 4, a general process flow of extracting the present-reference data from the buffer register 103 conforms to the process flow described in the embodiment 3 (FIG. 14).

In the embodiment 4, a status of data changing as the process flow develops conforms to the same in the embodiment 3 (FIG. 15).

In the embodiment 4, it is assumed that the data is stored in the memory 101 in the order of a, b, c . . . starting at the address number 0x100 as an initial state, as shown in FIG. 17. In the address register 102, the address value is 0x101, the number of the post-reference data is 0x3, and the number of the current-reference data is N.

Hereinafter, an example of the process is described.

In Step 1, the number of the post-reference data 0x3 and the address value 0x101 are separated and extracted from the address register 102.

In Step 2, the address value 0x101 separated in the Step 1 is used to thereby access the address 0x101 in the memory 101 so that data c, d and e are loaded and stored in the buffer register 103.

In Step 3, the number of the post-reference data 0x3 separated in the Step 1 and the number of current-reference data N are used to thereby extract only the present-reference data from the buffer register 103 in which the data c, d and e are stored. A specific example of the extracting process is described in Steps 3-1a through 3-3a.

In the Step 3-1a, the data c, d and e and c stored in the buffer register are shifted to left by the number of the post-reference data 0x3. A leading position of the present-reference data D1 is shifted to the uppermost-bit side of the buffer register 103. In a generally available processor, "0" is usually extended where there is no data on the lower-bit side (right) when the data is shifted (see FIG. 15).

In the Step 3-2a, a value is calculated by subtracting the number of the current-reference data N from "24".

In the Step 3-3a, the data shifted in the Step 3-1a is shifted to right by the value calculated in the Step 3-2a. A tail end of the present-reference data D1 is moved to the lowermost-bit side of the buffer register 103. The shift executed in the foregoing step is the logic shift. In the logic shift, "0" is generally extended where there is no data on the upper-bit side (left) (see FIG. 15).

In Step 4, the number of the current-reference data N is added to the address register 102 so that the value of the address register 102 is renewed. Then, the addition leads the number of the post-reference data to be renewed as (0x3+N). Further, the address value is also automatically renewed through the carry-up from the lower-bit side on which the number of the post-reference data is retained to the upper-bit side on which the address value is retained.

In the case of N=0x2, the number of the post-reference data can be represented by four bits because of 0x3+0x2=0x5, and the address value remains 0x101 with no carry-up. In the case of N=0x8, the number of the post-reference data is represented by four bits because of 0x3+0x8=0xb generating the carry-up, and the address value is thereby renewed from 0x101 to 0x102. In the case of N=0x5, the number of the post-reference data is represented by five bits because of 0x3+0xf=0x12 generating the carry-up, and the address value is thereby renewed from 0x101 to 0x102.

A further specific example is given to enhance the understanding.

FIG. 18A shows the data load from the address number 0x101 of the memory 101 and stored in the buffer register 103. Data c8, c7, c6, . . . and c1 of eight bits correspond to the data c of FIG. 17. Data d8, d7, . . . and d1 of eight bits correspond to the data d of FIG. 17. Data e8, e7, . . . and e1 of eight bits correspond to the data e of FIG. 17. A summed number of the bits is 24.

It is assumed that three bits of the data c8, c7 and c6 were referred to in the previous process. Therefore, the number of the post-reference data M is three. It is assumed that the number of the current-reference data N is nine, which corresponds to the data D2 of c5, c4, . . . c1, d8, . . . and d5 emphasized by the bold frame.

In FIG. 18B, the data row of 24 bits including c8, c7, . . . c1, d8, d7, . . . d1, e8, e7, . . . and e1 is shifted to left by the number of the post-reference data M=3 bits, and the data row of c5, . . . c1, d8, d7, . . . d1, e8, e7, . . . and e1 from the uppermost bit is stored while "0" is set in the lower three bits. A leading position of the bold frame corresponds to the 24th bit.

FIG. 18C shows a state in which the data row of 24 bits including c5, . . . c1, d8, d7, . . . d1, e8, e7, . . . e1, 0, 0, and 0 is shifted to right by nine bits, and "0" is set in 15 bits from the uppermost bit. The 15 bits, which is the amount of the shift to right, is obtained by subtracting the number of the current-reference data N=9 from "24". A tail end of the bold frame corresponds to the first bit. More specifically, c5, c4, . . . c1, d8, . . . and d5 of the data D2 are stored in nine bits from the lowermost bit of the buffer register 103, meaning that the present-reference data D2 has been extracted.

The addition of the number of the current-reference data N to the number of the post-reference data M results in M+N=3+9=12, and the number of the post-reference data M is renewed from "3" to "12" in the address register 102. There is no carry-up of the address value because "12" is below $2^4$ (four bits), and the initial address value 0x101 is accordingly maintained.

A process subsequent to the process of FIG. 18 is described referring to FIG. 19.

Figure 19A:
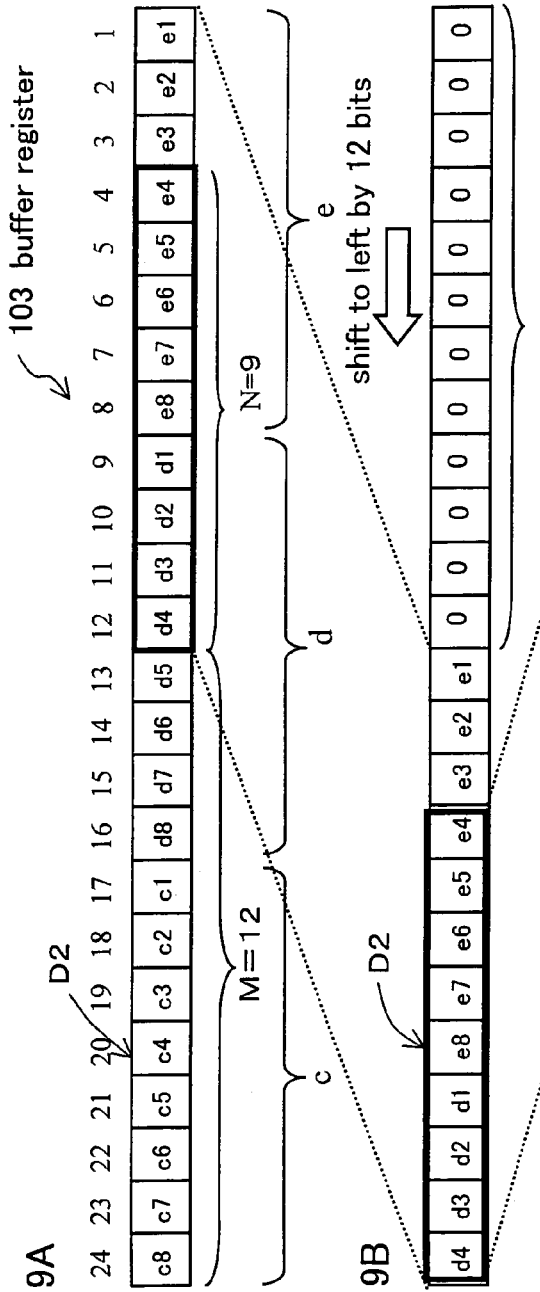
FIG. 19 are illustrations of an example 2 of the specific operation according to the embodiment 4.

FIG. 19A shows a state in which the data of the address number 0x101 in the memory 101 is loaded into the buffer register 103 (same as in FIG. 19A).

The reference of 12 bits of the data c8, c7, . . . c1, d8, d7, . . . and d5 was completed prior to the present process, and the number of the post-reference data M is therefore 12. The number of the current-reference data N is hypothetically nine here, which corresponds to the data D3 of d4, . . . d1, e8, e7, . . . e4 emphasized by the bold frame.

Figure 19B:
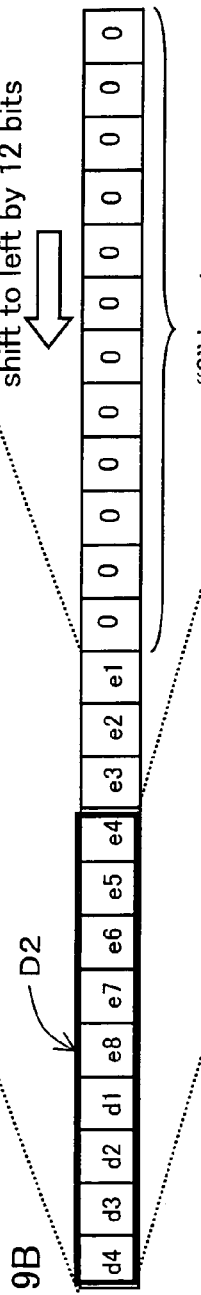

FIG. 19B shows a state in which the data row of 24 bits including c8, c7, . . . c1, d8, d7, . . . d1, e8, e7, . . . and e1 is shifted to left by the number of the post-reference data M=12 bits, and the data row of d4, d3, . . . d1, e8, e7, . . . and e1 from the uppermost bit is stored while "0" is set in the lower 12 bits. A leading position of the bold frame corresponds to the 24th bit.

Figure 19C:
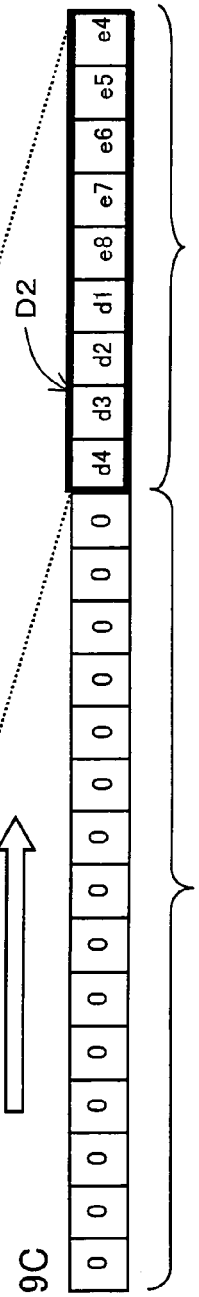

FIG. 19C shows a state in which the data row of 24 bits including d4, d3, . . . d1, e8, e7, . . . e1, 0, 0. . . and 0 is shifted to right by 15 bits, and "0" is set in 15 bits from the uppermost bit. The 15 bits by which the data row is shifted to right is obtained by subtracting the number of the current-reference data N=9 from "24". A tail end of the bold frame corresponds to the first bit. More specifically, d4, . . . d1, e8, e7, . . . and e4 of the data D3 are stored in nine bits from the lowermost bit of the buffer register 103, meaning that the present-reference data D2 has been extracted.

The addition of the number of the current-reference data N to the number of the post-reference data M results in M+N=12+9=21, and the number of the post-reference data M is renewed from "12" to "21" in the address register 102.

The address value is carried up because "21" falls into the range of equal to or more than $2^4$ (four bits) and accordingly renewed to be the next address value 0x102. The process now proceeds to the next address because the reference of the data for all of 16 bits constituting the data c and d has been completed, and the reference of data e has started. The number of the post-reference data M, "21", is "0x15" in the hexadecimal number and "0b10101" in the binary number. However, the lower four bits except for the fifth bit of the carry-up result in "0b0101", which is "0x5" in the hexadecimal number in response to that the upper five bits c8, c7, . . . and e4 of the data e have been referred to.

As shown in FIG. 17, when the process proceeds from the address number 0x101 to the next address number 0x102, data identical to the data e (e8, e7, . . . and e1) in the lower-side eight bits at the last address 0x101 is already stored in the upper eight bits of the next address, allowing the continued use. No extra monitoring and operation is necessary for the address renewal.

In the example shown in the embodiment 4, the data in the lower eight bits is also layed out in the upper eight bits of the next address, which enables the extraction of the data of at least nine bits resulting from eight bits + one bit at a time. Further, a memory capacity 4/3 times as large in comparison to the case of jamming data is required.

The address register 102 and the buffer register 103 in FIG. 1, which do not perform any special operation, do not require any exclusive register and can be realized using a general-purpose register generally used for a processor. However, in the same manner as in the access address, the number of the post-reference data and the like according to the conventional technology, the value of the address register 102 is necessary subjected to the saving/returning with respect to a blank space in the memory 101 or the like.

Embodiment 5

Figure 20:
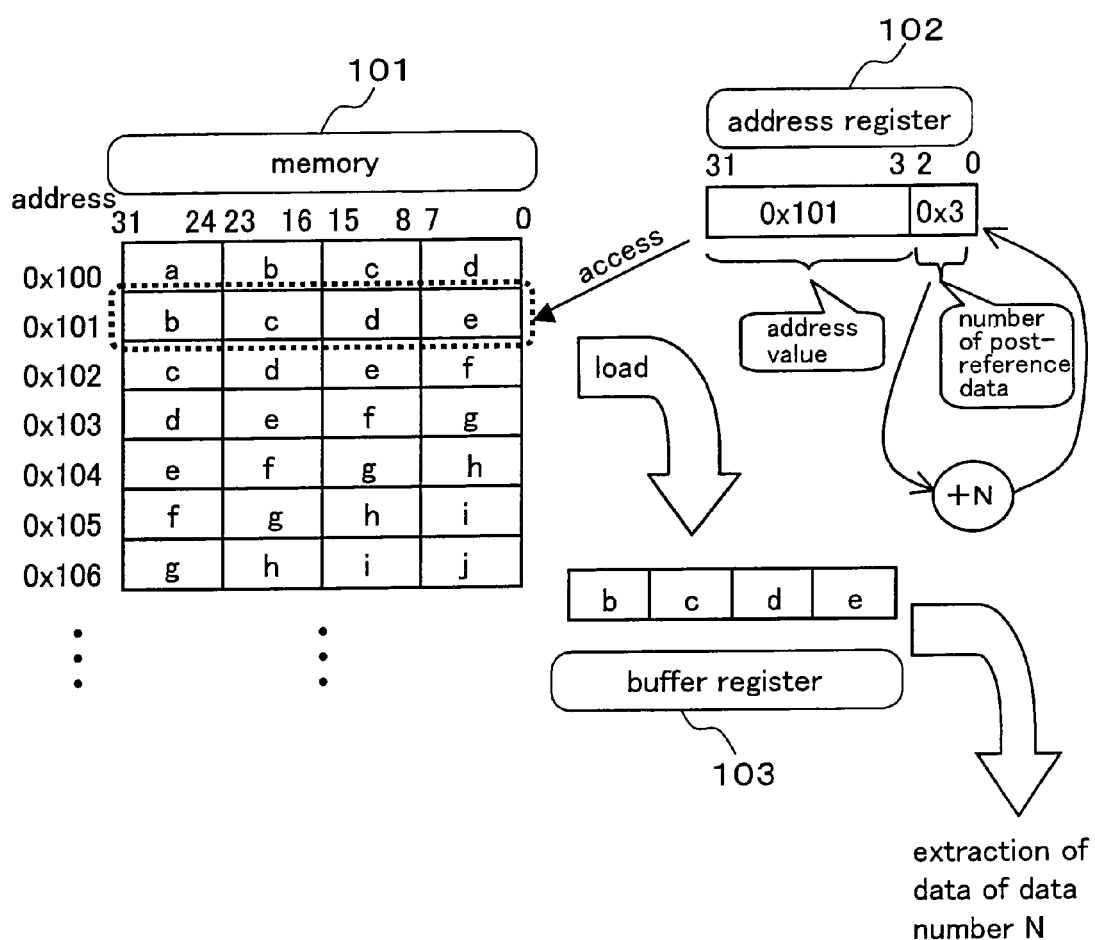
FIG. 20 is an illustration of an exemplified configuration of a variable length decoding device according to an embodiment 5 of the present invention.
Figure 21:
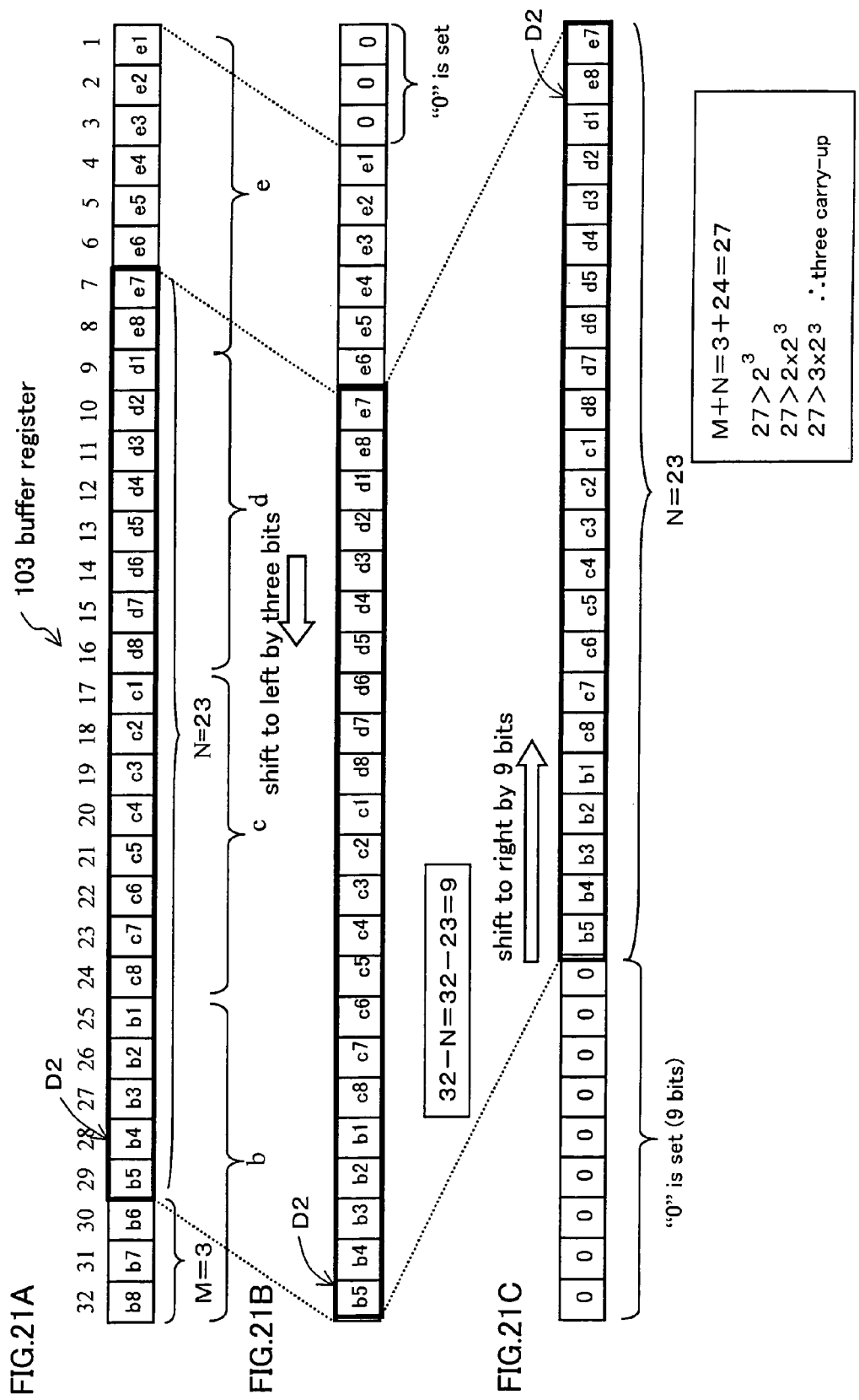
FIG. 21 are illustrations of an example of a specific operation according to the embodiment 5.

A variable length decoding device according to an embodiment 5 of the present invention is described referring to FIGS. 20 and 21. Though a processor according to the embodiment 5 is described based on a 32-bit processor, the present invention is not necessarily limited to such a processor.

In FIG. 20, the memory 101 memorizes data in which 32 bits constitute one word, and each address comprises upper eight bits, first intermediate eight bits, second intermediate eight bits and lower eight bits. Data identical to data in first intermediate bits of an address is layed out on an upper-bit side of a next address. Data identical to data in second intermediate bits is layed out in first intermediate bits of a next address. Data identical to data on a lower-bit side of an address is layed out in second intermediate bits of a next address.

The address register r102 is a register having a bit width of 32 and is comprised of an upper-bit side (first register portion) for retaining the address value and a lower-bit side (second register portion) having a bit width C (C=3 in the embodiment 5) for retaining the number of the post-reference data M.

The buffer register 103 is a register having a bit width B (B=32 in the embodiment 5) for retaining the data loaded from the memory 101.

A bit width A of the memory 101 is 32, the bit width C of the second register portion of the address register 102 is three, and a bit number D on the lower-bit side of the memory 101 is 24. There is a relationship represented by $D=A-2^C$ among A, C and D. There is a relationship represented by $A=4 \times P$ between A and C providing that $P=2^C$. In other words, $P=2^3=8$ and $A=4 \times 8=32$ are gained.

In the variable length decoding device according to the embodiment 5, a process flow of the variable length decoding conforms to the process flow according to the embodiment 1 (FIG. 2).

In the variable length decoding device according to the embodiment 5, a general process flow of extracting the present-reference data from the buffer register 103 conforms to the process flow of the embodiment 1 (FIG. 3).

In the variable length decoding device according to the embodiment 5, a status of data changing in accordance with the process flow shown in FIG. 3 is also represented by FIG. 4 as in the embodiment 1.

In the variable length decoding device according to the embodiment 5, it is assumed that the data is stored in the memory 101 in the order of a, b, c . . . starting at the address number 0x100 as an initial state, as shown in FIG. 20. In the address register 102, the address value is 0x101, the number of the post-reference data is 0x3, and the number of the current-reference data is N.

Hereinafter, an example of the process is described.

In Step 1, the number of the post-reference data 0x3 and the address value 0x101 are separated and extracted from the address register 102.

In Step 2, the address value 0x101 separated in the Step 1 is used to thereby access the address 0x101 in the memory 101 so that data b, c, d and e are loaded and stored in the buffer register 103.

In Step 3, the number of the post-reference data 0x3 separated in the Step 1 and number of current-reference data N are used to thereby extract only the present-reference data from the buffer register 103 in which the data b, c, d and e are stored. A specific example of the extracting process is described in Steps 3-1a through 3-3a.

In the Step 3-1a, the data b, c, d and e and c stored in the buffer register 103 are shifted left by the number of the post-reference data 0x3. A leading position of present-reference data D2 is shifted to the uppermost-bit side of the buffer register 103. In a generally available processor, "0" is usually extended where there is no data on a lower-bit side (right) when the data is shifted (see FIG. 4).

In the Step 3-2a, a value is calculated by subtracting the number of the current-reference data N from "32".

In the Step 3-3a, the data shifted in the Step 3-1a is shifted to right by the value calculated in the Step 3-2a. A tail end of the present-reference data D1 is moved to the lowermost-bit side of the buffer register 103. The shift executed in the foregoing step is the logic shift. In the logic shift, "0" is generally extended where there is no data on the upper-bit side (left) (see FIG. 4).

In Step 4, the number of the current-reference data N is added to the address register 102 so that the value of the address register 102 is renewed. Then, the addition leads the number of the post-reference data to be renewed as (0x3+N). Further, the address value is also automatically renewed through the carry-up from the lower-bit side on which the number of the post-reference data is retained to the upper-bit side on which the address value is retained.

In the case of N=0x2, the number of the post-reference data can be represented by three bits because of 0x3+0x2=0x5, and the address value remains 0x101 with no carry-up. In the case of N=0x8, the number of the post-reference data is represented by four bits in 0x3+0x8=0xb generating the carry-up, and the address value is thereby renewed from 0x101 to 0x102. In the case of N=0xf, the number of the post-reference data is represented by five bits in 0x3+0xf=0x12 generating the carry-up, and the address value is thereby renewed from 0x101 to 0x102.

A further specific example is given to enhance the understanding.

FIG. 21A shows data load from the address number 0x101 of the memory 101 and stored in the buffer register 103. Data b8, b7, b6, . . . and b1 of eight bits correspond to the data b of FIG. 20. Data c8, c7, c6, . . . and c1 of eight bits correspond to the data c of FIG. 20. Data d8, d7, . . . and d1 of eight bits correspond to the data d of FIG. 17. Data e8, e7, . . . and e1 of eight bits correspond to the data e of FIG. 20. A summed number of the bits is 32.

It is assumed that three bits of the data b8, b7 and b6 were referred to in the previous process. Therefore, the number of the post-reference data M is three. It is assumed that the number of the current-reference data N is 23, which corresponds to the data D2 of b5, b4, . . . b1, c8, . . . c1, d8, . . . d1, e8 and e7 emphasized by the bold frame.

In FIG. 21B, the data row of 32 bits including b8, . . . b1, c8, . . . c1, d8, . . . d1, e8, . . . and e1 is shifted to left by the number of the post-reference data M=3 bits, and the data row of b5, . . . b1, c8, . . . c1, d8, . . . d1, e8, . . . and e1 from the uppermost bit is stored, while "0" is set in the lower three bits. A leading position of the bold frame corresponds to the 32nd bit.

FIG. 21C shows a state in which the data row of 32 bits including b5, . . . b1, c8, . . . c1, d8, . . . d1, e8, . . . e1, 0, 0 and 0 is shifted to right by nine bits, and "0" is set in nine bits from the uppermost bit. The nine bits by which the data row is shifted to right is obtained by subtracting the number of the current-reference data N=23 from "32". A tail end of the bold frame corresponds to the first bit. More specifically, b5, b4, . . . b1, c8, . . . c1, d8, . . . d1, e8 and e7 of the data D2 are stored in 23 bits from the lower most bit of the buffer register 103, meaning that the present-reference data D2 has been extracted.

The addition of the number of the current-reference data N to the number of the post-reference data M results in M+N=3+23=26, and the number of the post-reference data M is renewed from "3" to "26" in the address register 102. The address value is subjected to three carry-ups to be renewed as 0x104 because "26" falls into the range of equal to or more than $3 \times 2^3$. The process now goes to three addresses ahead because the data in all of 24 bits constituting the data b, c and d has been completed, and the reference of the data E has commenced. "26", which is the post-reference data M, is "0x1a" in the hexadecimal number and "0b11010" in the binary number, however, "0b010" in the lower three bits except for the fourth and fifth bits of the carry-up resulting in "0x2" in the hexadecimal number. This corresponds to that the upper two bits e8 and e7 of the data e have been referred to.

As shown in FIG. 20, data identical to the data e (e8, e7, . . . and e1) of the lower-side eight bits at the address 0x101 which is three addresses back is already stored in the upper eight bits of the address 0x104, allowing the continued use. No extra monitoring and operation for the address renewal is necessary.

In the example shown in embodiment 5, the data of the lower 24 bits is also layed out in the upper 24 bits of the next address. Therefore, at least 25-bit data resulting from 24 bits + one bit can be extracted at a time.

Further, a memory capacity four times as large in comparison to the case of jamming data is required.

The address register 102 and the buffer register 103 in FIG. 20, which do not perform any special operation, do not require any exclusive register and can be realized using a general-purpose register generally used for a processor. However, in the same manner as in the access address, the number of the post-reference data and the like according to the conventional technology, the value of the address register 102 is necessary subjected to the saving/returning with respect to a blank space in the memory 101 or the like.

Embodiment 6

A variable length decoding device according to an embodiment 6 of the present invention is described referring to FIGS. 22 through 24. Though a processor according to the embodiment 6 is described based on a 32-bit processor, the present invention is not necessarily limited to such a processor.

In FIG. 22, the memory 101 memorizes data in which A bits (A=32 in the embodiment 6) constitute one word, and each address comprises upper eight bits, first intermediate eight bits, second intermediate eight bits and lower eight bits. In the memory 101, data identical to data on a lower-bit side of an address is layed out on an upper-bit side of a next address.

The address register 102 is a register having a bit width of 32 and comprised of an upper-bit side (first register portion) for retaining the address value and a lower-bit side (second register portion) having a bit width C (C=5 in the embodiment 6) for retaining the number of the post-reference data M.

The buffer register 103 is a register having a bit width B (B=32 in the embodiment 6) for retaining the data loaded from the memory 101.

The embodiment 5 is characterized in comprising a special adding device 104 for executing the addition of the value of the address register 102 and the current-reference data N.

The special adding device 104, when the number of the post-reference bits is M and the number of the current-reference bits is N, adds a quotient F (integer) of M+N/E (providing that E is an integer equal to or more than one as a result of A−D, and 32−8=24 in the embodiment 6) to the upper side of the address register 101 (first register portion) and sets a remainder G (integer) on the lower side of the address register 101 (second register portion).

The foregoing E includes a relationship represented by $E=H \times 2^L$. In the embodiment 6, $E=24=3 \times 2^3$, and accordingly H=3.

The data on the memory 101 is layed out in such manner that the data of the lower eight bits as a remainder of the upper 24 bits is also layed out on an upper side of a next address. More specifically, in the address 0x101, data d is stored in the upper eight bits, data e in the first intermediate bits, data f in the second intermediate bits and data g on the lower-bit side, in response to which the data g is stored on the upper-bit side of the address 0x102. Data j, which is stored on the lower-bit side of the address 0x102, is also stored on the upper-bit side of the next address 0x103.

In the variable length decoding device according to the embodiment 6, a process flow of the variable length decoding is conforms to the process flow described in the embodiment 1 (FIG. 2).

In the embodiment 6, a general process flow of extracting the present-reference data from the buffer register 103 conforms to the process flow described in the embodiment 1 (FIG. 3).

In the variable length decoding device according to the embodiment 6, a status of data changing as the process flow of FIG. 3 develops is shown in FIG. 4 as in the embodiment 1.

In variable length decoding device according to the embodiment 6, the data is stored in the memory 101 in the order of a, b, c. . . . starting at the address number 0x100 as an initial state, as shown in the drawing. In the address register 102, the address value is 0x101, the number of the post-reference data is 0x3, and the number of the current-reference data is N.

Hereinafter, an example of the process is described.

In Step 1, the number of the post-reference data 0x3 and the address value 0x101 are separated and extracted from the address register 102.

In Step 2, the address value 0x101 separated in the Step 1 is used to thereby access the address 0x101 in the memory 101 so that data d, e, f and g are loaded and stored in the buffer register 103.

In Step 3, the number of the post-reference data 0x3 separated in the Step 1 and number of current-reference data N are used to thereby extract only the present-reference data from the buffer register 103 in which the data d, e, f and g are stored. A specific example of the extracting process is described in Steps 3-1a through 3-3a.

In the Step 3-1a, the data d, e, f and g stored in the buffer register 103 are shifted to left by the number of the post-reference data 0x3. A leading position of present-reference data D2 is shifted to the uppermost-bit side of the buffer register 103. In a generally available processor, "0" is usually extended where there is no data on a lower-bit side (right) when the data is shifted (see FIG. 4).

In the Step 3-2a, a value is calculated by subtracting the number of the current-reference data N from "32".

In the Step 3-3a, the data shifted in the Step 3-1a is shifted to right by the value calculated in the Step 3-2a. A tail end of the present-reference data D2 is moved to the lowermost-bit side of the buffer register 103. The shift executed in the foregoing step is the logic shift. In the logic shift, "0" is generally extended where there is no data on an upper-bit side (left) (see FIG. 4).

In Step 4, the number of the current-reference data N is added to the address register 102 by means of the special adding device 104 so that the value of the address register 102 is renewed. Then, the addition leads the number of the post-reference data to be renewed as a remainder of (0x3+N)/24. Further, the address value is also automatically renewed from the lower-bit side on which the number of the post-reference data is retained through the addition of the quotient F of (0x3+N)/24 to the upper-bit side on which the address value is retained.

In the case of N=0x8, the number of the post-reference data is 0x3+0x8=0xa and therefore equal to or below 24, and the address value remains 0x101 with no carry-up. When M=0x13 and N=0x8, the number of the post-reference data is 0x13+0x8=0x1b (27), and the quotient of 27/24 is 0x1 with the remainder of 0x3. The address value is accordingly renewed to be 0x102 as a result of 0x101+0x1.

A further specific example is given to enhance the understanding.

Figure 23A:
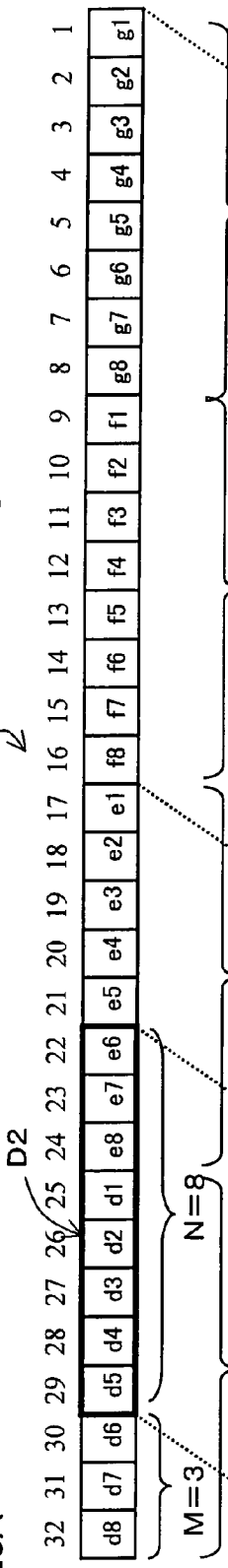
FIG. 23 are illustrations of an example 1 of a specific operation according to the embodiment 6.

FIG. 23A shows the data load from the address number 0x101 of the memory 101 and stored in the buffer register 103. Data d8, d7, d6 . . . and d1 of eight bits correspond to the data d of FIG. 22. Data e8, e7, e6 . . . and e1 of eight bits correspond to the data e of FIG. 22. Data f8, f7, . . . and f1 of eight bits correspond to the data f of FIG. 17. Data g8, g7, . . . and g1 of eight bits correspond to the data g of FIG. 22. A summed number of the bits is 32.

It is assumed that three bits of the data d8, d7 and d6 were referred to in the previous process. Therefore, the number of the post-reference data M is three. It is assumed that the number of the current-reference data N is eight, which corresponds to the data D2 of d5, d4, . . . d1, e8, e7 . . . and e6 emphasized by the bold frame.

Figure 23B:
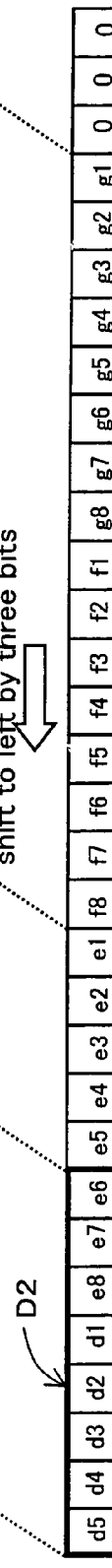

In FIG. 23B, the data row of 32 bits including d8, . . . d1, e8, . . . e1, f8, . . . f1, g8, . . . and g1 is shifted to left by the number of the post-reference data M=3 bits, and the data row of d5, . . . d1, e8, . . . e1, f8, . . . f1, g8, . . . and g1 from the uppermost bit is stored, while "0" is set in the lower three bits. A leading position of the bold frame corresponds to the 32nd bit.

Figure 23C:
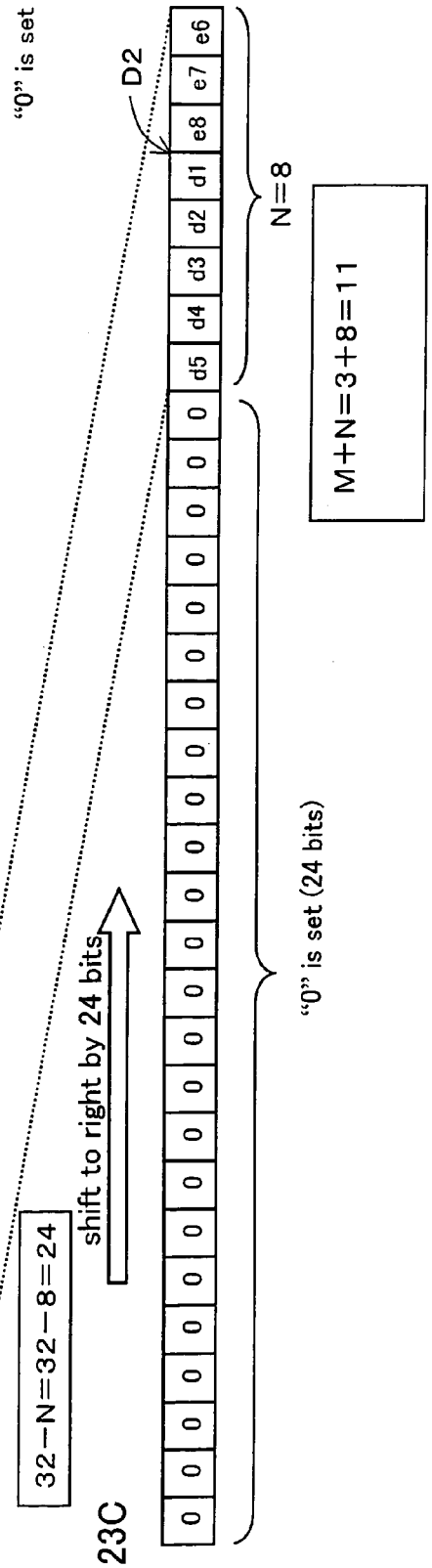

FIG. 23C shows a state in which the data row of 32 bits including d5, . . . d1, e8, . . . e1, f8 . . . f1, g8, . . . g1, 0, 0, and 0 is shifted to right by 24 bits, and "0" is set in 24 bits from the uppermost bit. The 24 bits by which the data row is shifted to right is obtained by subtracting the number of the current-reference data N=8 from "32". A tail end of the bold frame corresponds to the first bit. More specifically, d5, d4, . . . d1, e8, e7 . . . and e6 of the data D2 are stored in 23 bits from the lowermost bit of the buffer register 103, meaning that the present-reference data D2 has been extracted.

The addition of the number of the current-reference data N to the number of the post-reference data M results in M+N=3+9=12, and the number of the post-reference data M is renewed from "3" to "12" in the address register 102. There is no carry-up of the address value because "12" is below $2^4$ (four bits), and the initial address value 0x101 is accordingly maintained.

A process subsequent to the process of FIG. 18 is described referring to FIG. 19.

FIG. 19A shows a state in which the data of the address number 0x101 in the memory 101 is loaded into the buffer register 103 (same as in FIG. 19A).

The reference of 12 bits of the data c8, c7, . . . c1, d8, d7, . . . and d5 has been completed so far, and the number of the post-reference data M is therefore 12. The number of the data to be currently referred to N is hypothetically nine here, which corresponds to data D3 of d4, . . . d1, e8, e7, . . . e4 emphasized by the bold frame.

FIG. 19B shows a state in which the data row of 24 bits including c8, c7, . . . c1, d8, d7, . . . d1, e8, e7, . . . and e1 is shifted to left by the number of the post-reference data M=12, and the data row of d4, d3, . . . d1, e8, e7, . . . and e1 from the uppermost bit is stored while "0" is set in the lower 12 bits. A leading position of the bold frame corresponds to the 24th bit.

FIG. 19C shows a state in which the data row of 24 bits including d4, d3, . . . e1, e8, e7, . . . e1, 0, 0, . . . and 0 is shifted to right by 15 bits, and "0" is set in 15 bits from the uppermost bit. The 15 bits by which the data row is shifted to right is obtained by subtracting the number of the current-reference data N=9 from "24". A tail end of the bold frame corresponds to the first bit. More specifically, d4, . . . d1, e8, e7, . . . and e4 of the data D3 are stored in nine bits from the lowermost bit of the buffer register 103, meaning that the data D2 to be presently referred to has been extracted.

The addition of the number of the current-reference data N to the number of the post-reference data M results in M+N=3+8=11, and the number of the post-reference data M is renewed from "3" "11" in the address register 102. Because "11" is equal to or below 24, there is no addition to the address value and the initial address value 0x11 is maintained Next, it is assumed that 19 bits of the data d8, . . . d1, e8, . . . e1, f8, f7 and f6 were referred to so far. Therefore, the number of the post-reference data M=19. The number of the current-reference data N=8, which corresponds to the data D2 of f5, f4, . . . f1, g8, g7 and g6 emphasized by the bold frame.

FIG. 24 shows a state in which the data of 32 bits including d8, d1, e8, . . . e1, f8, . . . f1, g8, . . . and g1 are shifted to left by the number of the post-reference data M=19 bits. The data row of f5, . . . f1, g8, . . . and g1 from the uppermost bit is stored, while "0" is set in the lower 19 bits. A leading position of the bold frame corresponds to the 32nd bit.

FIG. 24C shows a state in which the data row of 32 bits including f5, ... f1, g8, ... g1, 0, ... and 0 is shifted to right by 24 bits, and "0" is set in 24 bits from the uppermost bit. The 24 bits, which is the amount of the shift to right, is obtained by subtracting the number of the current-reference data N=8 from "32". A tail end of the bold frame corresponds to the first bit. More specifically, f5, f4, ... f1, g8, g7 and g6 of the data D2 is stored in 23 bits from the lowermost bit of the buffer register 103, meaning that the present-reference data D2 has been extracted.

When the number of the current-reference data N is added to the number of the post-reference data M, M+N=19+8=27. The quotient of 27/24 is one with the remainder of 3. Accordingly, "3" is set as the number of the post-reference data in the address register 102. Further, one is added to the address value and the address value is thereby renewed to be 0x102. The process now proceeds to one address ahead because the reference of the data in all of 24 bits constituting the data d, e and f has been completed and the reference of the data g has started. "3", which is the number of the post-reference data M, corresponds to that the upper three bits g8, g7 and g6 of the data g have been referred to.

As shown in FIG. 22, data identical to the data g (g8, g7, ... and g1) in the lower-side eight bits at the previous address 0x101 is already stored in the upper eight bits of the address 0x102, allowing the continued use. Any extra monitoring and operation for the address renewal is not necessary.

In the example shown in the embodiment 6, the data of the lower eight bits is also layed out in the upper eight bits of the next address, allowing the data of at least nine bits resulting from eight bits + one bit to be extracted at a time. Further, a memory capacity 1.25 times as large in comparison to the case of jamming data is required.

The address register 102 and the buffer register 103 in FIG. 20, which do not perform any special operation, do not require any exclusive register and can be realized using a general-purpose register generally used for a processor. However, in the same manner as in the access address, the number of the post-reference data and the like according to the conventional technology, the value of the address register 102 is necessary subjected to the saving/returning with respect to a blank space in the memory 101 or the like.

Embodiment 7

Figure 25:
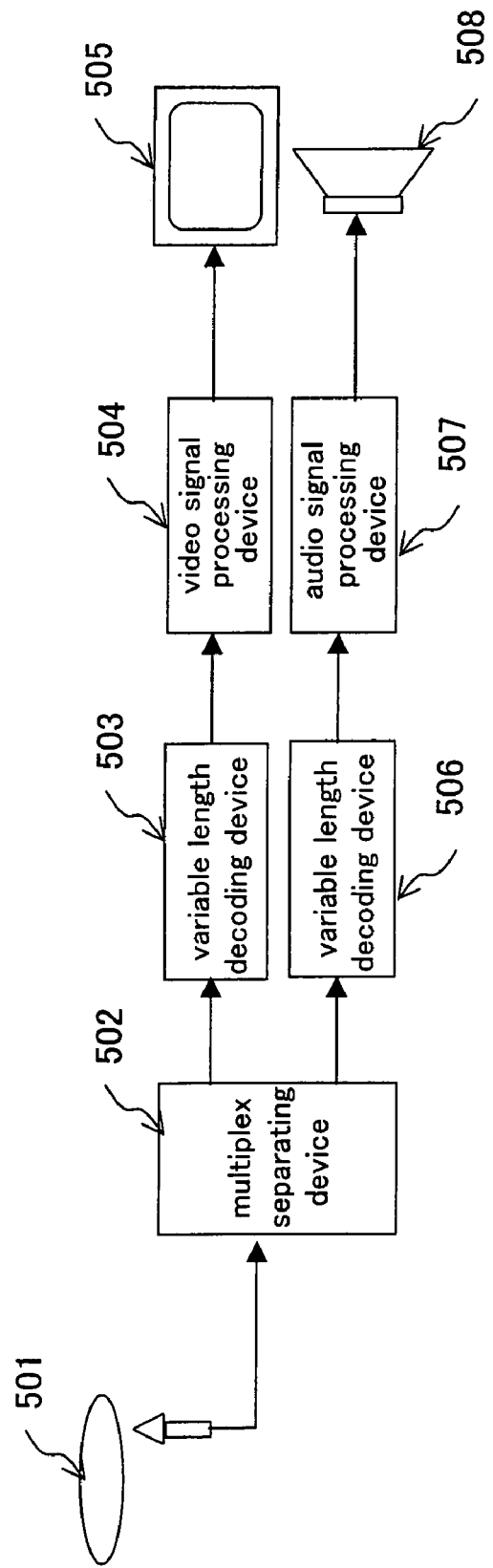
FIG. 25 is a schematic view of a reproduction system according to an embodiment 7 of the present invention.

FIG. 25 is a schematic view of a reproduction system using the variable length decoding device according to the preferred embodiments.

As shown in FIG. 25, a system stream transmitted from a data storing device 501 in which a system stream, such as DVD, is stored and a stream delivery device such as internet and broadcast is separated into a stream which is variable-length-coded for video and a stream which is variable-length-coded for audio by means of a multiplex separating device 502.

The stream compressed in the variable length coding for video is subjected to a variable length decoding in a variable length decoding device 503 and outputted to a video signal processing device 504. In the video signal processing device 504, a video signal is reproduced based on the variable-length-decoded data and outputted to a video display device 505.

The stream compressed in the variable length coding for audio is subjected to a variable length decoding in a variable length decoding device 506 and outputted to an audio signal processing device 507. In the audio signal processing device 507, an audio signal is reproduced based on the variable-length-decoded data and outputted to an audio output device 508.

When the variable decoding device according to the present invention is used as the variable length decoding devices 503 and 506, a reproduction system can be established using a processor having a low processing performance at a reasonable cost.

What is claimed is:

1. A variable length decoding device comprising:
   a memory for laying out data which is identical to data memorized on a lower-bit side at an optional address on an upper-bit side at an address subsequent to the optional address and memorizing the layed-out data;
   a buffer register having a bit width at least equal to a bit width of the memory for storing data loaded from the memory; and
   an address register for storing a value of an address at which the memory is accessed (address value) on an upper-bit side and storing number of data which was referred to in the buffer register on a lower-bit side, characterized in that
   a data shift operation using the number of the data which was referred to and number of data which is currently referred to is executed to the buffer register so that data to be presently referred to is extracted from the buffer register for the variable length decoding,
   the number of the data which was referred to on the lower-bit side of the address register is renewed by adding thereto the number of the data which has been currently referred to in response to the extraction of the data from the buffer register, and
   the address value to be stored on the upper-bit side of the address register is maintained when the renewed number of the data which was referred to on the lower-bit side of the address register is not carried up, and the carry-up is used to renew the address value to be a next address value when the renewed number of the data is carried up.

2. A variable length decoding device as claimed in claim 1, characterized in that
   the memory memorizes data regarding a bit number A (integer of at least two) as one word, the bit number A is 2×P (providing that $P=2^C$), and C is an integer of at least one.

3. A variable length decoding device as claimed in claim 1, characterized in that
   the memory memorizes data regarding a bit number A (integer of at least two) as one word, the bit number A is 3×P (providing that $P=2^C$), and C is an integer of at least one.

4. A variable length decoding device as claimed in claim 1, characterized in that
   the memory memorizes data regarding a bit number A (integer of at least two) as one word, the bit number A is (3/2)×P (providing that $P=2^C$), and C is an integer of at least one.

5. A variable length decoding device as claimed in claim 1, characterized in that
   the memory memorizes data regarding a bit number A (integer of at least two) as one word, the bit number A is 4×P (providing that $P=2^C$), and C is an integer of at least one.

6. A variable length decoding device comprising:
   a memory for memorizing data regarding a bit number A (integer of at least two) as one word;

a buffer register having a bit width B (integer of at least A) for storing data loaded from the memory; and an address register for storing a value of an address at which the memory is accessed (address value) on an upper-bit side and storing number of data which was referred to M in the buffer register (integer of at least zero) on a lower-bit side having a bit width C (integer of at least one), characterized in that data identical to data memorized on a lower-bit side of a bit number D (integer represented by $A-2^C$) at an optional address is layed out on an upper-bit side of a bit number D at an address subsequent to the optional address in the memory, data to be presently referred to is extracted for the variable length decoding through a data shift operation executed using the number of the data which was referred to M and number of data which is currently referred to N (integer of at least one) from the buffer register, and, in response to the extraction, providing that E is an integer of at least one and obtained by an operation of A−D, F and G are integers, F is a quotient obtained by an operation of (M+N)/E, and G is a remainder thereof, the quotient F is added to the upper-bit side of the address register so that the address value to be stored on the upper-bit side is renewed and the remainder G is set on the lower-bit side of the address register so that the number of the data which was referred to M to be stored on the lower-bit side is renewed.

7. A variable length decoding device as claimed in claim 6, characterized in that the E is $H \times 2^L$ (H and L are integers of at least one).

8. A variable length decoding device as claimed in claim 7, characterized in that the H is three.

9. A variable length decoding device as claimed in any of claims 1 through 8, characterized in that a shifter for executing a shift while masking the data which was referred to is further provided as a device for extracting the data to be presently referred to from the buffer register.

10. A variable length decoding method using a variable length decoding device comprising:

a memory for memorizing data regarding a bit number A (integer of at least two) as one word;

a buffer register having a bit width B (integer of at least A) for storing data loaded from the memory; and an address register for storing an address at which the memory is accessed on an upper-bit side and storing number of data which was referred to M in the buffer register (integer of at least zero) on a lower-bit side having a bit width C (integer of at least one), characterized in including:

a first step in which a value of the access address (address value) and the number of the data which was referred to M (integer of at least zero) are separated from the address register;

a second step in which data identical to data memorized on a lower-bit side of a bit number D (integer represented by $A-2^C$) at an optional address is layed out on an upper-bit side of a bit number D at an address subsequent to the optional address in the memory, the memory is accessed using the access, and the data memorized in the memory is loaded into the buffer register;

a third step in which data to be presently referred to is extracted for the variable length decoding through a data shift operation executed using the number of the data which was referred to M and number of data which is currently referred to N (integer of at least one) from the buffer register; and a fourth step in which the number of the data which was referred to M to be stored on the lower-bit side of the address register is renewed by adding thereto the number of the data which is currently referred to N in response to the extraction of the data to be presently referred to, and the address value to be stored on the upper-bit side of the address register is maintained when the renewed number of the data which was referred to on the lower-bit side of the address register is not carried up and the carry-up is used to renew the address value to be a next address value when the renewed number of the data is carried up.

11. A variable length decoding method as claimed in claim 10, characterized in that the A is 2×P (providing that $P=2^C$).

12. A variable length decoding method as claimed in claim 10, characterized in that the A is 3×P (providing that $P=2^C$).

13. A variable length decoding method as claimed in claim 10, characterized in that the A is 3/2×P (providing that $P=2^C$).

14. A variable length decoding method as claimed in claim 10, characterized in that the A is 4×p (providing that $P=2^C$).

15. A variable length decoding method as claimed in any of claims 10 through 14, characterized in that the data which was referred to is shifted while being masked when the data to be presently referred to is extracted from the buffer register in the third step.

16. A variable length decoding method using a variable length decoding device comprising:

a memory for memorizing data in which a bit number A (integer of at least two) constitutes one word, the memory memorizing data identical to data memorized on a lower-bit side of a bit number D (integer represented by $A-2^C$) at an optional address on an upper-bit side of a bit number D at an address subsequent to the optional address;

a buffer register having a bit width B (integer of at least A) for storing data loaded from the memory; and an address register for storing a value of an address (address value) at which the memory is accessed on an upper-bit side and storing number of data which was referred to M in the buffer register (integer of at least zero) on a lower-bit side having a bit width C (integer of at least one), characterized in including:

a first step in which an access is made to the memory using the value of the access address stored in the address register to thereby load data into the buffer register;

a second step in which a data shift operation is executed using the number of the data which was referred to M (integer of at least zero) stored on the lower-bit side of the buffer register and number of data which is currently referred to N (integer of at least one) so that the data to be referred to for the variable length decoding is extracted from the buffer register; and a third step in which, providing that E is an integer of at least one obtained by an operation of A−D, F and G are integers, a quotient obtained by an operation of (M+N)/E is F, and G is a remainder thereof, the address value to be stored on the upper-bit side of the address register required for the extraction of the data to be referred to is renewed by adding the quotient F to the upper-bit side, and number of data which was referred to M to be stored on the lower-bit side of the address register is renewed by setting the remainder G on the lower-bit side.

17. A variable length decoding method as claimed in claim 16, characterized in that the E is H×2$^L$ (H and L are integers of at least one).

18. A variable length decoding method as claimed in claim 17, characterized in that the H is three.

19. A variable length decoding method as claimed in any of claims 10 through 14, characterized in that the data which was referred to is shifted while being masked when the data to be presently referred to is extracted from the buffer register in the second step.

20. A reproduction system characterized in comprising:

a variable length decoding device as claimed in any of claims 1 through 8;

an input device for inputting a stream including data variable-length-decoded by the variable length decoding device; and a reproduction device for processing the data decoded by the variable length decoding device into a signal and reproducing the signal.

* * * * *